United States Patent
Hariguchi et al.

(10) Patent No.: US 6,717,946 B1
(45) Date of Patent: Apr. 6, 2004

(54) METHODS AND APPARATUS FOR MAPPING RANGES OF VALUES INTO UNIQUE VALUES OF PARTICULAR USE FOR RANGE MATCHING OPERATIONS USING AN ASSOCIATIVE MEMORY

(75) Inventors: Yoichi Hariguchi, Menlo Park, CA (US); Rina Panigrahy, Sunnyvale, CA (US); Samar Sharma, Sunnyvale, CA (US); Ashwath Nagaraj, Los Altos, CA (US)

(73) Assignee: Cisco Technology Inc., San Jose, CA (US)

( * ) Notice: Subject to any disclaimer, the term of this patent is extended or adjusted under 35 U.S.C. 154(b) by 6 days.

(21) Appl. No.: 10/284,759

(22) Filed: Oct. 31, 2002

(51) Int. Cl.$^7$ ................................. H04L 12/28
(52) U.S. Cl. ........................ 370/392; 370/389
(58) Field of Search ................... 370/389, 392, 370/395.31, 395.32, 395.4, 351, 352, 353, 397, 399, 469, 473

(56) References Cited

U.S. PATENT DOCUMENTS

| | | |
|---|---|---|
| 5,088,032 A | 2/1992 | Bosack |
| 5,319,763 A | 6/1994 | Ho et al. |
| 5,481,540 A | 1/1996 | Huang |
| 5,515,370 A | 5/1996 | Rau |
| 5,740,171 A | 4/1998 | Mazzola et al. |
| 5,842,040 A | 11/1998 | Hughes et al. |
| 5,852,569 A | 12/1998 | Srinivasan et al. |
| 5,898,689 A | 4/1999 | Kumar et al. |
| 5,920,886 A | 7/1999 | Feldmeier |
| 5,930,359 A | 7/1999 | Kempke et al. |
| 6,000,008 A | 12/1999 | Simcoe |
| 6,061,368 A | 5/2000 | Hitzelberger |

(List continued on next page.)

OTHER PUBLICATIONS

Jon P. Wade and Charles G. Sodini, "A Ternary Content Addressable Search Engine," IEEE Journal of Solid–State Circuits, vol. 24, No. 4, Aug. 1989, pp. 1003–1013.

Teuvo Kohonen, Content–Addressable Memories, 1987, pp. 128–129 and 142–144, Springer–Verlag, New York.

Brian Dipert, ed., "Special–purpose SRAMs Smooth the Ride," EDN, Jun. 24, 1999, pp. 93–104.

"What is a CAM (Content–Addressable Memory)?," Application Brief AB–N6, Rev. 2a, Music Semiconductors, Milpitas, CA, Sep. 30, 1998, 4 pages.

"Reading Out the Valid LANCAM Memory Entries," Application Brief AB–N4, Rev. 1a, Music Semiconductors, Milpitas, CA, Sep. 30, 1998, 4 pages.

"Extending the LANCAM Comparand," Application Brief AB–N3, Rev. 1.0a Draft, Music Semiconductors, Milpitas, CA, Sep. 30, 1998, 4 pages.

(List continued on next page.)

*Primary Examiner*—Phirin Sam
(74) *Attorney, Agent, or Firm*—The Law Office of Kirk D. Williams

(57) ABSTRACT

Methods and apparatus are disclosed for maintaining one or more ranges and identifying whether a value matches one of the ranges and optionally which range is matched. One implementation includes a range programming engine for generating one or more mapped subtrie values identifying each range, each of the mapped subtrie values identifying a different subset of the range. An associative memory stores the mapped subtrie ranges. A mapping engine receives a particular value and generates a lookup word including a mapped representation of the particular value. The associative memory performs a lookup operation to identify whether or not the particular value is within one of the ranges. In this manner, only a small number of associative memory entries are required to identify whether a mapped particular value falls within the range. The particular range matched can be identified such as by a read operation in an adjunct memory based on the address of the matching entry.

37 Claims, 17 Drawing Sheets

U.S. PATENT DOCUMENTS

| | | | |
|---|---|---|---|
| 6,091,725 | A | 7/2000 | Cheriton et al. |
| 6,097,724 | A | 8/2000 | Kartalopoulos |
| 6,141,738 | A | 10/2000 | Munter et al. |
| 6,148,364 | A | 11/2000 | Srinivasan et al. |
| 6,181,698 | B1 | 1/2001 | Hariguchi |
| 6,219,748 | B1 | 4/2001 | Srinivasan et al. |
| 6,236,658 | B1 | 5/2001 | Essbaum et al. |
| 6,237,061 | B1 | 5/2001 | Srinivasan et al. |
| 6,240,485 | B1 | 5/2001 | Srinivasan et al. |
| 6,243,667 | B1 | 6/2001 | Kerr et al. |
| 6,285,378 | B1 | 9/2001 | Duluk, Jr. |
| 6,289,414 | B1 | 9/2001 | Feldmeier et al. |
| 6,295,576 | B1 | 9/2001 | Ogura et al. |
| 6,307,855 | B1 | 10/2001 | Hariguchi |
| 6,308,219 | B1 | 10/2001 | Hughes |
| 6,374,326 | B1 | 4/2002 | Kansal et al. |
| 6,377,577 | B1 | 4/2002 | Bechtolsheim et al. |
| 6,389,506 | B1 | 5/2002 | Ross et al. |
| 6,430,190 | B1 | 8/2002 | Essbaum et al. |
| 6,434,662 | B1 | 8/2002 | Greene et al. |
| 6,526,474 | B1 | 2/2003 | Ross |
| 6,535,951 | B1 | 3/2003 | Ross |
| 2001/0028651 | A1 * | 10/2001 | Murase ....................... 370/392 |

OTHER PUBLICATIONS

"Advantages of CAM in ASIC–Based Network Address Processing," Application Brief AB–N11, Rev. 1.2a Draft, Music Semiconductors, Milpitas, CA, Sep. 30, 1998, 4 pages.

"Virtual Memory Applications of the MU9C1480A LAN-CAM," Application Note AN–N3, Rev. 1a, Music Semiconductors, Milpitas, CA, Sep. 30, 1998, 12 pages.

"Using the MU9C1965A LANCAM MP for Data Wider than 128 Bits," Application Note AN–N19, Rev. 1a, Music Semiconductors, Milpitas, CA, Sep. 30, 1998, 16 pages.

"Fast IPv4 and IPv4 CIDR Address Translation and Filtering Using the MUAC Routing CoProcessor (RCP)," Application Note AN–N25, Rev. 0a, Music Semiconductors, Milpitas, CA, Oct. 1, 1998, 16 pages.

"Using MUSIC Devices and RCPs for IP Flow Recognition," Application Note AN–N27, Rev. 0, Music Semiconductors, Milpitas, CA, Oct. 21, 1998, 20 pages.

"Wide Ternary Searches Using Music CAMs and RCPs," Application Note AN–N31, Rev. 0, Music Semiconductors, Milpitas, CA, Apr. 13, 1999, 8 pages.

Donald R. Morrison, "Patricia—Practical Algorithm to Retrieve Information Coded in Alphanumeric," Journal of the ACM, vol. 15, No. 4, Oct. 1968, pp. 514–534.

Waldvogel et al., "Scalable High Speed IP Routing Lookups," Proc. SIGCOMM '97, ACM, 1997, pp. 25–36.

Lampson et al., "IP Lookups Using Multiway and Multicolumn Search," Proc. Infocom 98, Mar. 1998, 24 pages.

V. Srinivasan and George Varghese, "Faster IP Lookups using Controlled Prefix Expansion," ACM SIGMETRICS Performance Evaluation Review, vol. 26 No. 1, Jun. 1998, pp. 1–10.

Stefan Nilsson and Gunnar Karlsson, "Fast Address Look–up for Internet Routers," Proceedings of IEEE Broadband Communications, Apr. 1998, 12 pages.

William N. Eatherton, Hardware–Based Internet Protocol Prefix Lookups, Master's thesis, Server Institute, Washington University, St. Louis, MO, May 1999, 109 pages.

Lampson et al., "IP Lookups Using Multiway and Multicolumn Search," IEEE Transactions on Networking, vol. 7, No. 3, Jun. 1999, pp. 324–334.

Lockwood et al., "Field Programmable Port Extender (FPX) for Distributed Routing and Queuing," Proceedings of the ACM/SIGDA international symposium on Field programmable gate arrays, Feb. 2000, pp. 137–144.

Ruiz–Sanchez et al., "Survey and Taxonomy of IP Address Lookup Algorithms," IEEE Network Magazine, vol. 15, No. 2, Mar./Apr. 2001, pp. 8–23.

Pankaj Gupta and Nick McKewon, "Algorithms for Packet Classification," IEEE Network Magazine, vol. 15, No. 2, Mar./Apr. 2001, pp. 24–32.

Iyer et al., "ClassiPI: An Architecture for Fast and Flexible Packet Classification," IEEE Network Magazine, vol. 15, No. 2, Mar./Apr. 2001, pp. 33–41.

Waldvogel et al., "Scalable High Speed Prefix Matching," ACM Transactions on Computer Systems, vol. 19, No. 4, Nov. 2001, pp. 440–482.

Devavrat Shah and Pankaj Gupta, "Fast Incremental Updates on Ternary–CAMs for Routing Lookups and Packet Classification," Proc. Hot Interconnects VIII, Aug. 2000, Stanford. IEEE Micro, vol. 21, No. 1, Jan./Feb. 2001, 9 pages.

Waldvogel et al., "Scalable Best Matching Prefix Lookups," PODC 98, ACM 1998.

Radia Perlman, Interconnections: Bridges, Routers, Switches, and Internetworking Protocols, Second Edition, Addison–Wesley, 2000, pp. 347–365.

Pankaj Gupta and Nick McKeown, "Algorithms for Packet Classification," IEEE Network Special Issue, Mar./Apr. 2001, vol. 15, No. 2, pp. 24–32 (reprint 29 pages).

Srinivasan et al., "Packet Classification Using Tuple Space Search," ACM Computer Communication Review, 1999. ACM SIGCOMM'99, Sep. 1999 (12 pages).

Srinivasan et al., "Fast and Scalable Layer Four Switching," ACM Computer Communication Review, 28(4):191–202, 1998. ACM SIGCOMM'98, Sep. 1998 (12 pages).

Stefan Nilsson and Gunnar Karlsson, "IP–Address Lookup Using LC–Tries," IEEE Journal on Selected Areas in Communications, Jun. 1999 (12 pages).

* cited by examiner

EXEMPLARY MAPPING FUNCTION
200

A < KEY < B  ⟶  MASK(A+1, B-1)

A <= KEY <= B  ⟶  MASK (A, B)

A = KEY = B  ⟶  2^A

K BITS  ⟶  2^K MAPPED BITS

MAPPED UPPER BOUNDARY   ...000000000001000...  ← 201

MAPPED LOWER BOUNDARY   ...0001000000000000...  ← 202

RANGE ENTRY   ...000**********000...  ← 203

EXEMPLARY VALUES AND RANGES 210

| VALUE OR RANGE | MAPPED VALUE OR RANGE |
|---|---|
| 2 | 00100000 |
| 5 | 00000100 |
| [2,5] | 00****00 |
| (2,5) | 00011000 |
| [3,4] | 000**000 |
| [0,3] | ****0000 |
| [3,7] | 000***** |
| [2,2] | 00*00000 |

211 → (row 1), 212 → (row 2), 213 → (row 3), 214 → (row 4), 215 → (row 5), 216 → (row 6), 217 → (row 7), 218 → (row 8)

FIGURE 2A

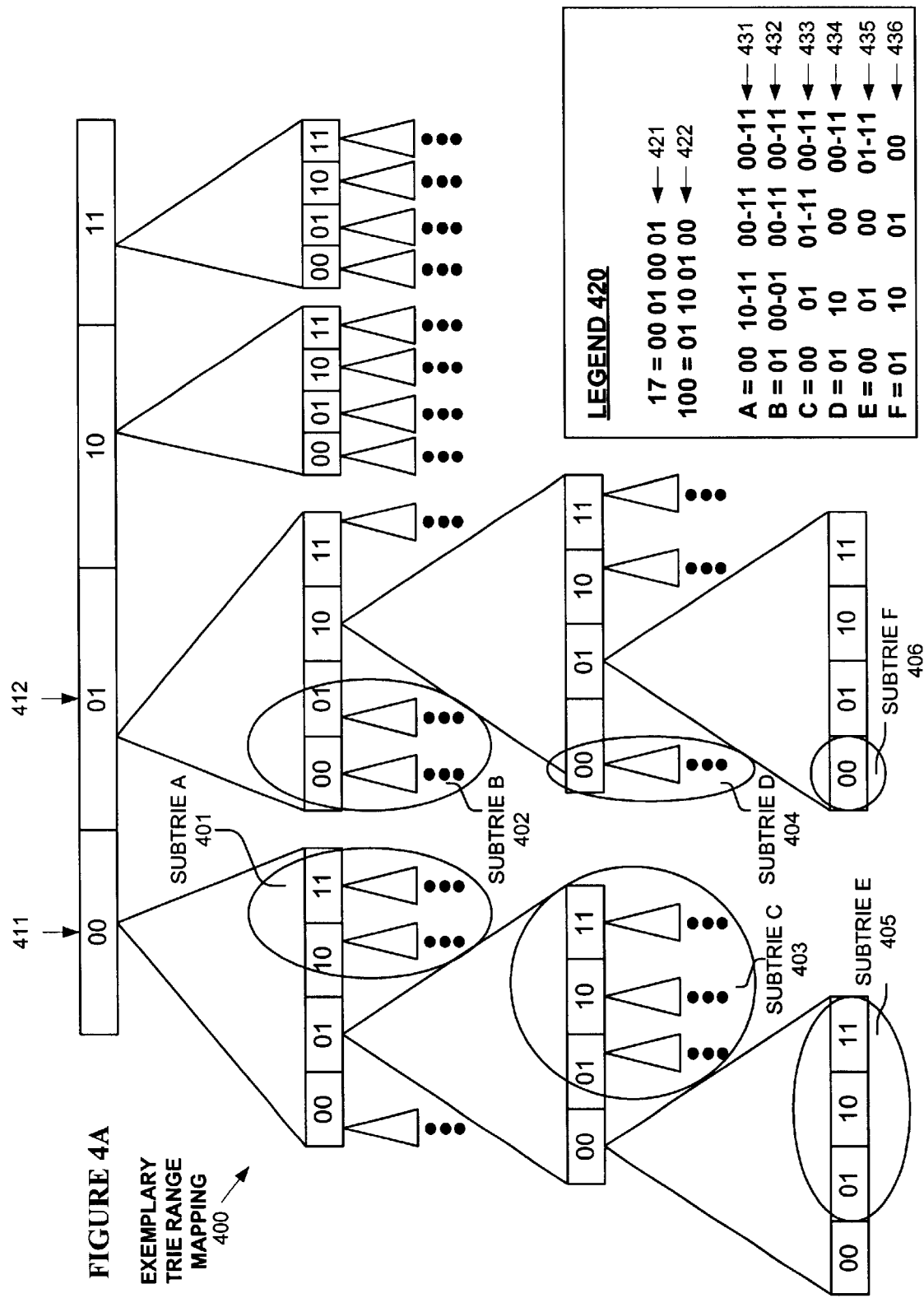

| FIG. 4A SUBTRIE | SUBTRIE RANGES | | | |
|---|---|---|---|---|
| 431 → A | 00 | 10-11 | 00-11 | 00-11 |
| 432 → B | 01 | 00-01 | 00-11 | 00-11 |
| 433 → C | 00 | 01 | 01-11 | 00-11 |
| 434 → D | 01 | 10 | 00 | 00-11 |
| 435 → E | 00 | 01 | 00 | 01-11 |
| 436 → F | 01 | 10 | 01 | 00 |

| RANGE K=2 | MAPPED RANGE VALUES | MAPPED RANGE VALUES |
|---|---|---|
| 441 → 00 - 00 | *000 | 1000 |
| 442 → 00 - 01 | **00 | **00 |
| 443 → 00 - 10 | ***0 | ***0 |
| 444 → 00 - 11 | **** | **** |
| 445 → 01 - 01 | 0*00 | 0100 |
| 446 → 01 - 10 | 00 | 00 |
| 447 → 01 - 11 | 0*** | 0*** |
| 448 → 10 - 10 | 00*0 | 0010 |
| 449 → 10 - 11 | 00** | 00** |
| 450 → 11 - 11 | 000* | 0001 |

| BINARY VALUE K=2 | MAPPED VALUE $2^K$ = 4 BITS |
|---|---|
| 00 | 1000 |
| 01 | 0100 |
| 10 | 0010 |
| 11 | 0001 |

| FIG. 4A SUBTRIE | MAPPED SUBTRIE RANGES | | | |
|---|---|---|---|---|
| 451 → A | *000 | 00** | **** | **** |
| 452 → B | 0*00 | **00 | **** | **** |
| 453 → C | *000 | 0*00 | 0*** | **** |
| 454 → D | 0*00 | 00*0 | *000 | **** |
| 455 → E | *000 | 0*00 | *000 | 0*** |
| 456 → F | 0*00 | 00*0 | 0*00 | *000 |

| FIG. 4A SUBTRIE | SUBTRIE RANGES | | | |
|---|---|---|---|---|
| 431 → A | 00 | 10-11 | 00-11 | 00-11 |
| 432 → B | 01 | 00-01 | 00-11 | 00-11 |
| 433 → C | 00 | 01 | 01-11 | 00-11 |
| 434 → D | 01 | 10 | 00 | 00-11 |
| 435 → E | 00 | 01 | 00 | 01-11 |
| 436 → F | 01 | 10 | 01 | 00 |

| RANGE K=2 | MAPPED RANGE VALUES | MAPPED RANGE VALUES |
|---|---|---|
| 461 → 00 - 00 | 0** | 000 |
| 462 → 00 - 01 | *0* | *00 |
| 463 → 00 - 10 | **0 | **0 |
| 464 → 00 - 11 | *** | *** |
| 465 → 01 - 01 | 10* | 100 |
| 466 → 01 - 10 | 1*0 | 1*0 |
| 467 → 01 - 11 | 1** | 1** |
| 468 → 10 - 10 | *10 | 110 |
| 469 → 10 - 11 | *1* | 11* |
| 470 → 11 - 11 | **1 | 111 |

| BINARY VALUE K=2 | MAPPED VALUE $(2^K)-1$ = 3 BITS |
|---|---|
| 00 | 000 |
| 01 | 100 |
| 10 | 110 |
| 11 | 111 |

| FIG. 4A SUBTRIE | MAPPED SUBTRIE RANGES | | | |
|---|---|---|---|---|
| 471 → A | 0** | *1* | *** | *** |
| 472 → B | 10* | *0* | *** | *** |
| 473 → C | 0** | 10* | 1** | *** |
| 474 → D | 10* | *10 | 0** | *** |
| 475 → E | 0** | 10* | 0** | 1** |
| 476 → F | 10* | *10 | 10* | 0** |

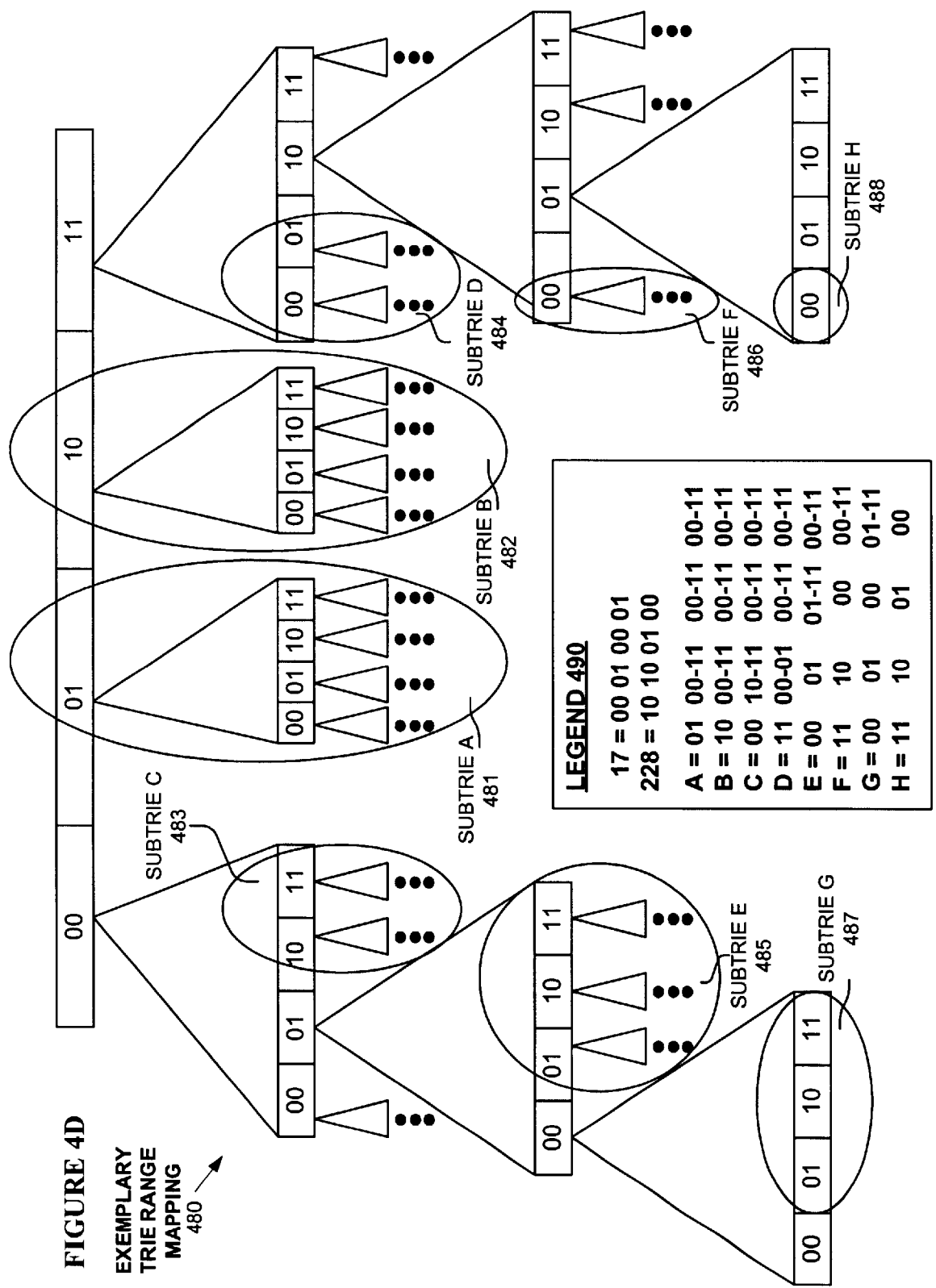

METHODS AND APPARATUS FOR MAPPING RANGES OF VALUES INTO UNIQUE VALUES OF PARTICULAR USE FOR RANGE MATCHING OPERATIONS USING AN ASSOCIATIVE MEMORY

FIELD OF THE INVENTION

This invention especially relates to scheduling of packets, processes and/or other entities used in communications, computer systems and/or other systems; and more particularly, the invention relates to mapping ranges of values into unique values of particular use for range matching operations using an associative memory.

BACKGROUND OF THE INVENTION

The communications and computer industries are rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP).

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Known approaches of packet classification include using custom application-specific integrated circuits (ASICs), custom circuitry, software or firmware controlled processors, binary and ternary content-addressable memories (CAMs). A ternary CAM (TCAM) is a special type of fully associative memory which stores data with three logic values: '0', '1' or '*' (don't care). Each TCAM entry includes a value and a mask. These entries are stored in the TCAM in decreasing order of priority, such as in a decreasing order of the length of prefixes. For a given input, the TCAM compares it against all of the entries in parallel, and returns the entry with the highest priority that matches the input lookup word. An entry matches the input lookup word if the input and the entry value are identical in the bits that are not masked out. A TCAM provides a fast mechanism for performing a longest matching prefix of a particular value, but natively does not provide a mechanism for directly performing operations on ranges.

In performing packet classification, a determination is often made whether a field of a packet matches a range of values. For example, a router may need to filter or only allow packets having a source or destination port number within a particular range of port numbers. Especially when processing packets, this operation typically needs to be performed very efficiently at typically at a line speed rate. Another application that typically relies on range search operations includes coordinating access to computer-readable medium, such a disk or memory. In this exemplary application, the processing of the packet or data may be limited by the rate at which a range operation is performed.

A known implementation uses a TCAM to maintain a range, and a lookup operation is performed on the TCAM with a value provided in a lookup word to identify whether the value matches the range. However, for a field having w bits, this implementation requires (2w−2) TCAM entries. Thus, for a common sixteen bit field (e.g., for storing a port number), up to thirty TCAM entries are required. And if a lookup operation must be performed to determine if both a source port and destination port are matched, then up to thirty times thirty or 900 TCAM entries are required. This implementation is quite expensive and is limiting in the number of ranges that can be maintained in a TCAM. Needed are methods and apparatus for maintaining sets of ranges and for determining whether a value matches a range.

SUMMARY OF THE INVENTION

Methods and apparatus are disclosed for maintaining one or more ranges and identifying whether a value matches one of the ranges and optionally which range is matched. One embodiment includes a range programming engine for generating one or more mapped subtrie values identifying a range, each of the mapped subtrie values identifying a different subset of the range. An associative memory stores the mapped subtrie ranges. A mapping engine receives a particular value and generates a lookup word including a mapped representation of the particular value. The associative memory performs a lookup operation based on the lookup word to identify whether or not the particular value is within one of the stored ranges (or the only stored range). If more than one ranges are stored in the set of associative memory entries on which the lookup operation is performed, then particular range matching the value can be identified by manipulating the lookup result, such as, but not limited to a data structure lookup operation or calculation based on the lookup result, a read operation based on the address of the matching entry in an adjunct memory, etc.

In one embodiment, the mapped representation of the particular value includes a bitmap with a single set bit, the position of the single set bit within the bitmap corresponding to the particular value. In one embodiment, each of the multiple mapped subtrie values includes no bits of value one. In one embodiment, the mapped particular value includes a value bitmap, the value bitmap including a bit transition, the position of the bit transition corresponding to the particular value. In one embodiment, a subset of the multiple mapped subtrie values each include a contiguous set of one or more wildcards, the position of the contiguous set of one or more wildcards identifying values within the range. In one embodiment, the mapped representation of the particular value includes a bitmap with a single set bit, the position of the single set bit within the bitmap corresponding to the particular value. In one embodiment, a subset of the multiple mapped subtrie values each include a contiguous set of one or more ones, the position of the contiguous set of one or more ones identifying values within the range. In one embodiment, the mapped representation of the particular value includes a bitmap with a single set bit, the position of the single set bit within the bitmap corresponding to the particular value. In one embodiment, the associative memory includes multiple associative memory entry cells, each of the multiple associative memory cells including multiple bit comparator cells coupled to an OR gate to generate a hit or miss indication.

DESCRIPTION OF THE DRAWINGS

The appended claims set forth the features of the invention with particularity. The invention, together with its advantages, may be best understood from the following detailed description taken in conjunction with the accompanying drawings of which:

FIG. 2A illustrates a mapping mechanism used in one embodiment for mapping ranges and values into mapped values of particular use for storage in an associative memory;

FIG. 4A illustrates a mechanism for generating one or more subtrie values identifying a range, each of the subtrie values identifying a different subset of the range;

FIG. 4B illustrates mapped values based on the example illustrated in FIG. 4A and the mapping mechanism illustrated in FIG. 2A;

FIG. 4C illustrates mapped values based on the example illustrated in FIG. 4A and the mapping mechanism illustrated in FIG. 3A;

FIG. 4D illustrates a mechanism for generating one or more subtrie values identifying a range, each of the subtrie values identifying a different subset of the range.

DETAILED DESCRIPTION

Figure 1A:
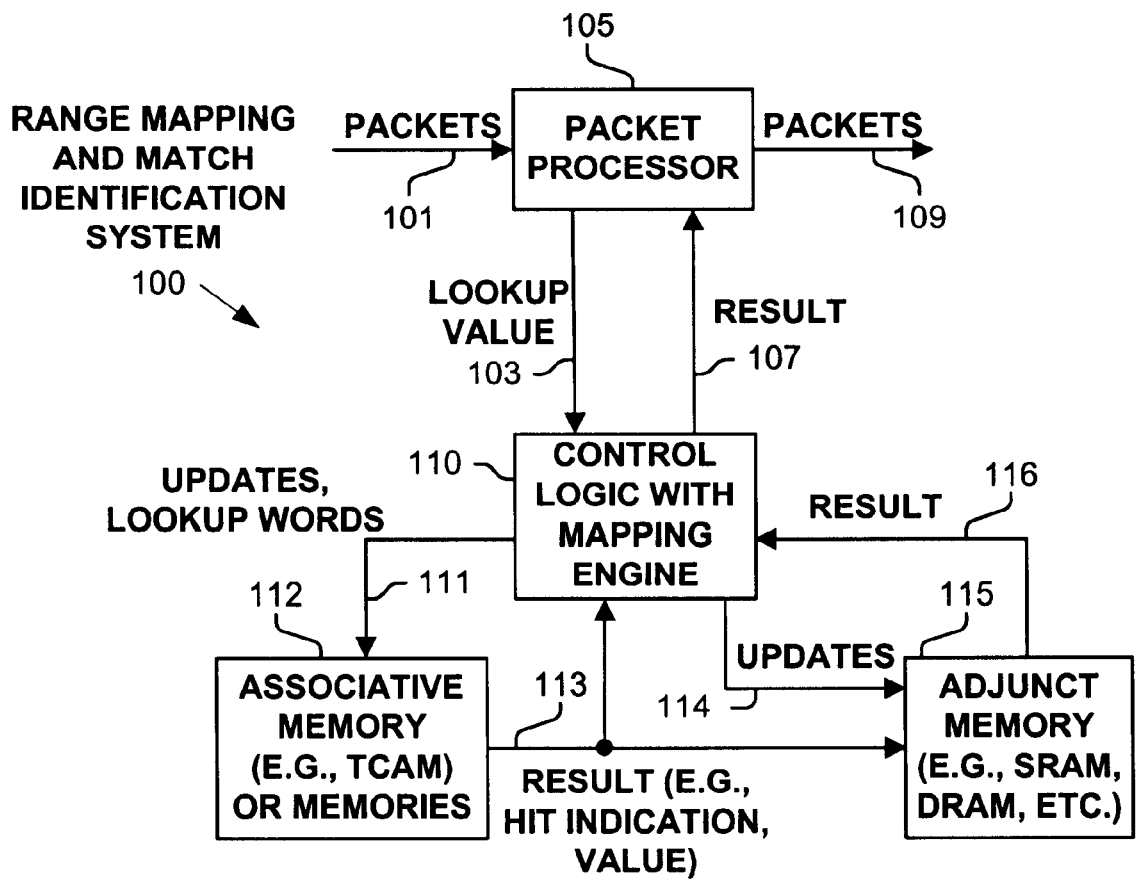
FIGS. 1A–E are block diagrams of various embodiments for maintaining one or more ranges and identifying whether a value matches one or more of the ranges and optionally the identity of the matching range.

Methods and apparatus are disclosed for maintaining a range and identifying whether a value matches the range. Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable medium containing instructions. The embodiments described hereinafter embody various aspects and configurations within the scope and spirit of the invention, with the figures illustrating exemplary and non-limiting configurations.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or identification of a packet. Moreover, these packets may contain one or more types of information, including, but not limited to, voice, data, video, and audio information. The term "item" is used herein to refer to a packet or any other unit or piece of information or data. The phrases "processing a packet" and "packet processing" typically refer to performing some steps or actions based on the packet, and which may or may not include modifying and/or forwarding the packet.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may be performed in the same or in a different serial or parallel ordering and/or by different components and/or processes, threads, etc., and/or over different connections and be combined with other functions in other embodiments in keeping within the scope and spirit of the invention. Furthermore, the term "identify" is used generically describe any manner or mechanism for directly or indirectly ascertaining something, which may included, but is not limited to receiving, retrieving from memory, determining, calculating, generating, etc.

Moreover, the terms "network" and "communications mechanism" are used generically herein to describe one or more networks, communications mediums or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, storage mechanism, and other storage and signaling mechanisms including interfaces and devices such as network interface cards and buffers therein, as well as any communications devices and signals received and transmitted, and other current and evolving technologies that a computerized system can interpret, receive, and/or transmit. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more or an organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc. The term "associative memory" refers to all types of known or future developed associative memories, including, but not limited to binary and ternary content-addressable memories, hash tables, TRIE and other data structures, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before the another, but rather provides a mechanism to distinguish between particular units. Additionally, the use of a singular tense of a noun is non-limiting, with its use typically including one or more of the particular item rather than just one (e.g., the use of the word "memory" typically refers to one or more memories without having to specify "memory or memories," or "one or more memories" or "at least one memory", etc.) Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modify or not modifying the coupled signal or communicated information. The term "subset" is used to indicate a group of all or less than all of the elements of a set. Moreover, the term "or" is used herein to identify a selection of one or more, including all, of the conjunctive items.

Methods and apparatus are disclosed for maintaining one or more ranges and identifying whether a value matches one of the ranges and optionally which range is matched. One embodiment includes a range programming engine for generating one or more mapped subtrie values identifying each range, each of the mapped subtrie values identifying a different subset of the range. An associative memory stores the mapped subtrie ranges. A mapping engine receives a particular value and generates a lookup word including a mapped representation of the particular value. The associative memory performs a lookup operation based on the lookup word to identify whether or not the particular value is within one of the ranges. In this manner, only a small number of associative memory entries are required to identify whether a mapped particular value falls within the range. If more than one ranges are stored in the set of associative memory entries on which the lookup operation is performed, then particular range matching the value can be identified by manipulating the lookup result, such as, but not limited to a data structure lookup operation or calculation based on the lookup result, a read operation based on the address of the matching entry in an adjunct memory, etc. In one embodiment, a lookup operation is performed on associative memory entries representing multiple ranges. In one embodiment, a subset of the associative memory entries are searched using known techniques, such as including a tag identifier as part of each associative memory entry, and thus only searching those with the same tag identifier included in the lookup word provided to the associative memory.

Any mapping function can be used which maps the range to a unique value. For example, in one embodiment, the mapped representation of the particular value includes a bitmap with a single set bit, the position of the single set bit within the bitmap corresponding to the particular value. In one embodiment, each of the multiple mapped subtrie values includes no bits of value one. In one embodiment, the mapped particular value includes a value bitmap, the value bitmap including a bit transition, the position of the bit transition corresponding to the particular value. In one embodiment, a subset of the multiple mapped subtrie values each include a contiguous set of one or more wildcards, the position of the contiguous set of one or more wildcards identifying values within the range. In one embodiment, the mapped representation of the particular value includes a bitmap with a single set bit, the position of the single set bit within the bitmap corresponding to the particular value. In one embodiment, a subset of the multiple mapped subtrie values each include a contiguous set of one or more ones, the position of the contiguous set of one or more ones identifying values within the range. In one embodiment, the mapped representation of the particular value includes a bitmap with a single set bit, the position of the single set bit within the bitmap corresponding to the particular value. In one embodiment, the associative memory includes multiple associative memory entry cells, each of the multiple associative memory cells including multiple bit comparator cells coupled to an OR gate to generate a hit or miss indication.

FIG. 1A illustrates one embodiment of a range mapping and match identification system 100, which may be part of a router or other communications or computer system, for maintaining one or more ranges using an associative memory and for identify a matching range based on a mapped lookup word. Such ranges may be mapped into a single or multiple associative memory entries in accordance with the invention. In one embodiment, control logic 110 programs, updates and performs lookup operations on associative memory or memories 112 with classes of associative memory entries by providing updates and mapped lookup words 111. In one embodiment, control logic 110 includes custom circuitry, such as, but not limited to discrete circuitry, ASICs, memory devices, processors, etc. Control logic 110 also stores identifiers of the corresponding range and/or actions to be taken via updates 114 in adjunct memory or memories 115. A hit result 113 is typically provided to control logic 110 and to adjunct memory or memories 115, which produces result 116 (e.g., an indication of a corresponding matching range). In one embodiment, a single chip or ASIC contains system 100. In one embodiment, a single chip or ASIC contains system 100 except for packet processor 105. In one embodiment, less than all or even no two components of system 100 reside on the same chip or ASIC.

In one embodiment, packets 101 are received by packet processor 105. In addition to other operations (e.g., packet routing, security, etc.), packet processor 105 typically generates one or more values to determine if they match a range identified in associative memory or memories 112, these values including, but not limited to those based on one or more fields of one or more of the received packets 101 and possibly from information stored in data structures or acquired from other sources. Packet processor 105 typically generates a lookup value 103 which is provided to control logic 110, which maps the lookup value into a lookup word 111 and initiates one or more associative memory lookup operations on associative memory or memories 112. A result 107 (e.g., whether a range is matched and possibly the identify of the matching range) is typically returned to packet processor 105, and in response, one or more of the received packets are manipulated and forwarded as indicated by packets 109.

Figure 1B:
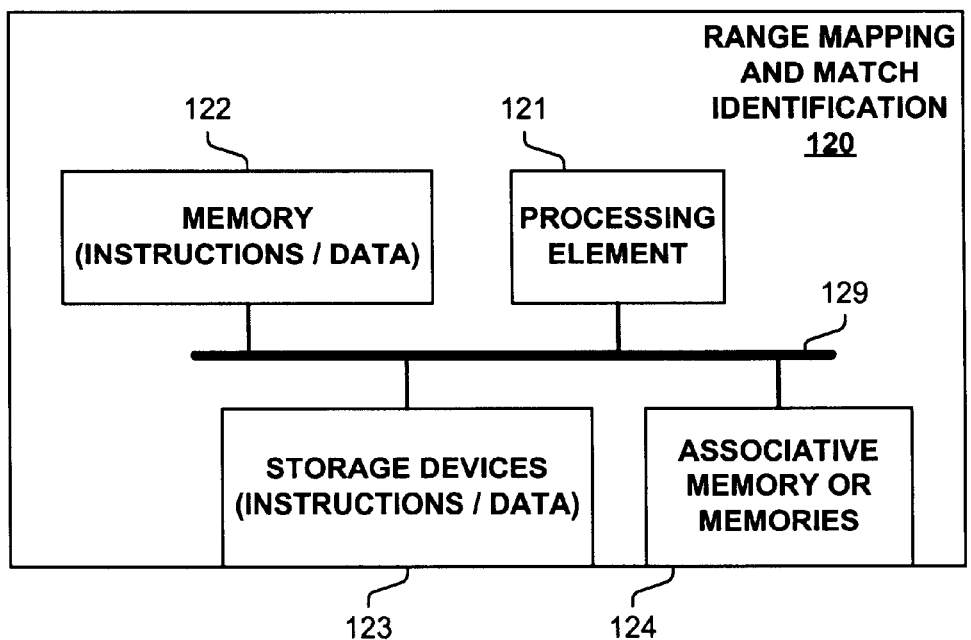

FIG. 1B illustrates one embodiment of a range mapping and match identification system 120, which may be part of a router or other communications or computer system, for maintaining one or more ranges using an associative memory and for identify a matching range based on a mapped lookup word. Such ranges may be mapped into a single or multiple associative memory entries in accordance with the invention. In one embodiment, system 120 includes a processing element 121, memory 122, storage devices 123, and associative memory or memories 124, which are coupled via one or more communications mechanisms 129 (shown as a bus for illustrative purposes). Various embodiments of system 120 may include more or less elements. In one embodiment, a single chip or ASIC contains system 120. In one embodiment, less than all, even no two components, of system 120 reside on the same chip or ASIC.

The operation of system 120 is typically controlled by processing element 121 using memory 122 and storage devices 123 to perform one or more tasks or processes, such as mapping ranges and values according to an embodiment of the invention, and programming and performing a lookup operation on associative memory or memories 124. Memory 122 is one type of computer-readable medium, and typically comprises random access memory (RAM), read only memory (ROM), flash memory, integrated circuits, and/or other memory components. Memory 122 typically stores computer-executable instructions to be executed by processing element 121 and/or data which is manipulated by processing element 121 for implementing functionality in accordance with one embodiment of the invention. Storage devices 123 are another type of computer-readable medium, and typically comprise solid state storage media, disk drives, diskettes, networked services, tape drives, and other storage devices. Storage devices 123 typically store computer-executable instructions to be executed by processing element 121 and/or data which is manipulated by processing element 121 for implementing functionality in accordance with one embodiment of the invention.

Figure 1C:
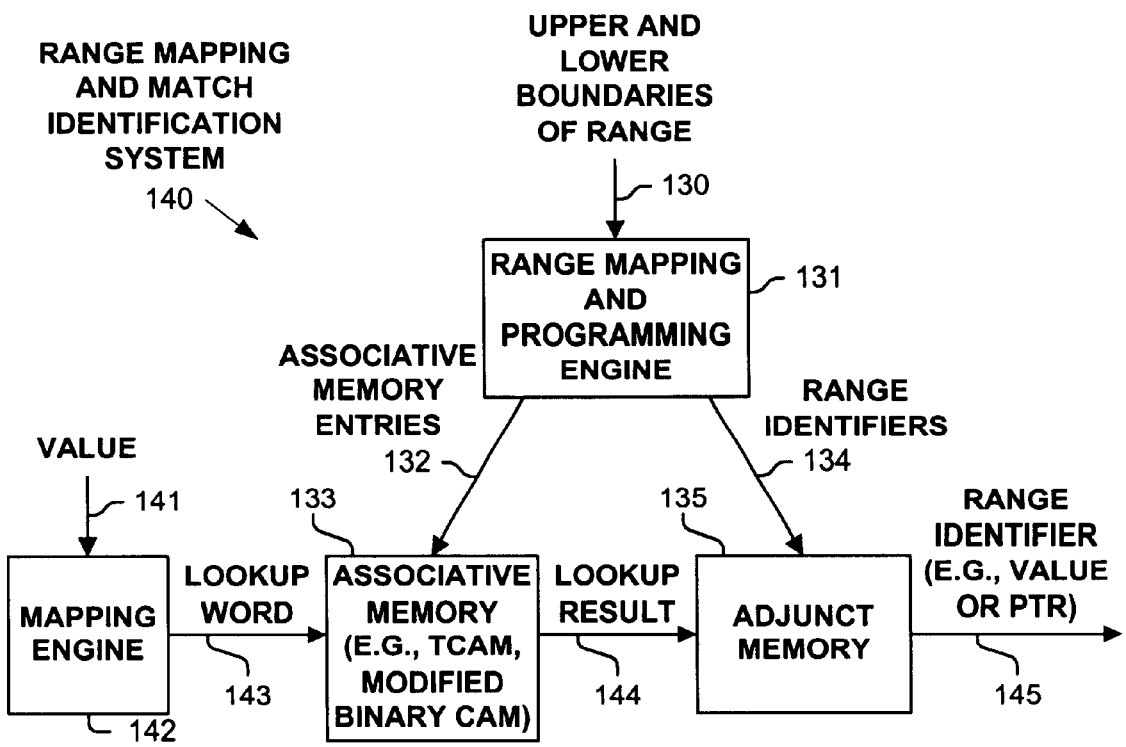

FIG. 1C illustrates one embodiment of a range mapping and match identification system 140, which may be part of a router or other communications or computer system, for maintaining one or more ranges using an associative memory and for identify a matching range based on a mapped lookup word. Such ranges may be mapped into a single or multiple associative memory entries in accordance with the invention. In one embodiment, indications 130 of upper and lower boundaries of the range are received by range mapping and programming engine 131, which generates one or more associative memory entries 132 based on the selected mapping operations and the one or more ranges. Range mapping and programming engine 131 typically also programs range identifiers 134 into adjunct memory 135 at locations corresponding to the associative memory entries such that the particular range can be identified based on the address of the matching associative memory entry.

Typically, during operation, a value 141 is identified and provided to a mapping engine 142 (or the mapped value is identified). Value 141 could be extracted from a field of a packet or from any other source or application. Mapping engine 142, using the same mapping methodology used by range mapping and programming engine 131 to generate associative memory entries 132, generates a mapped representation of value 141, and lookup word 143 includes this mapped representation of value 141. A lookup operation is performed in associative memory 133 based on lookup word 143 to generate a lookup result 144 which is used directly for further processing or used by adjunct memory 135 to retrieve a range identifier 145 when there was a hit generated by the lookup operation performed by associative memory 133.

Figure 1D:
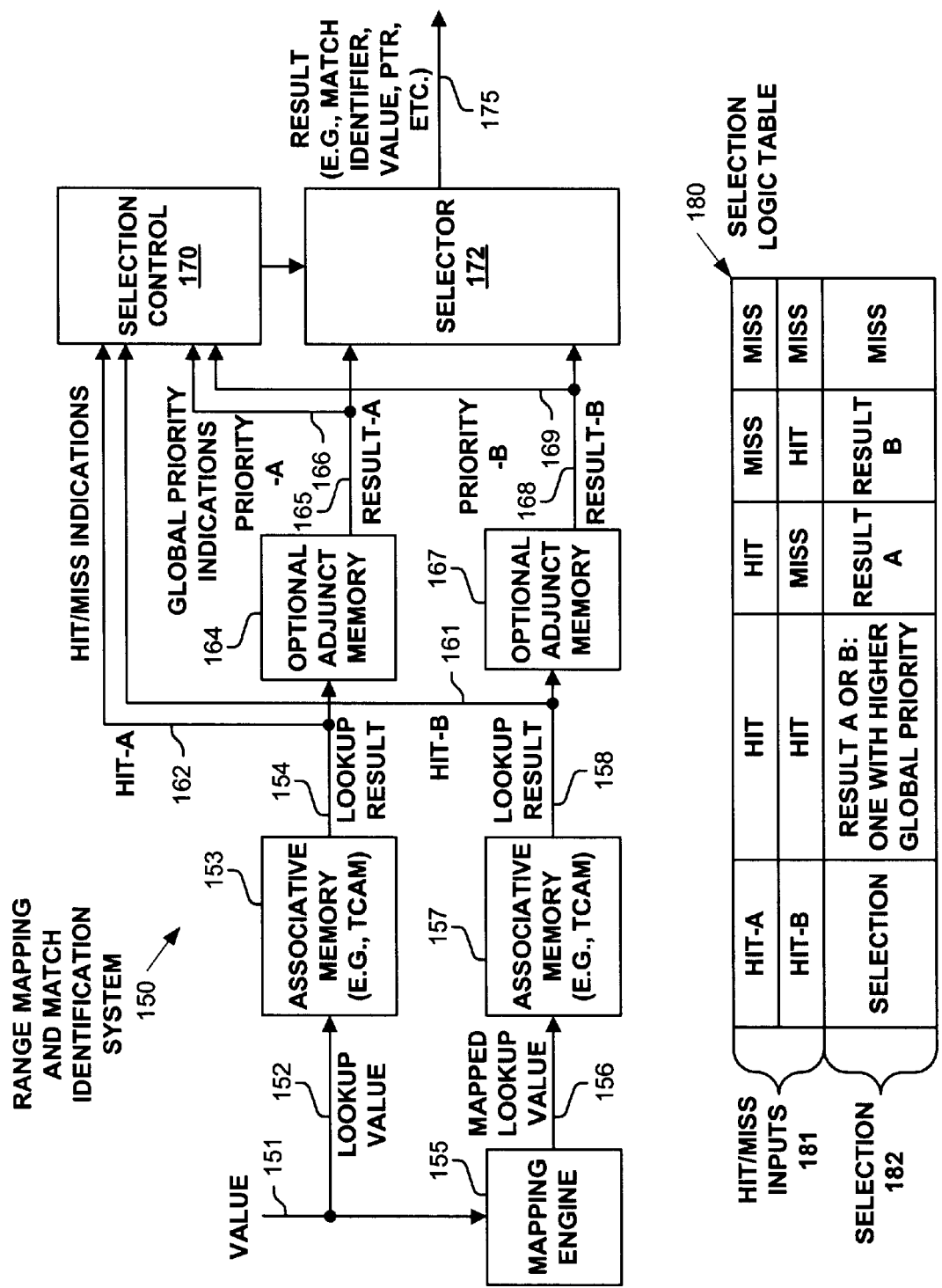

FIG. 1D illustrates one embodiment of a range mapping and match identification system 150, which may be part of a router or other communications or computer system, for maintaining one or more ranges using an associative memory and for identify a matching range based on a mapped lookup word. Such ranges may be mapped into a single or multiple associative memory entries in accordance with the invention. In some embodiments, not all values or ranges will be desired to be mapped as they will produce more associative memory entries than required in its native format. However, in many applications such as implementing an access control list, the order of values indicate a relative priority to other values and this relative priority ordering must be maintained. Range mapping and match identification system 150 illustrates one mechanism for simultaneously performing lookup operations on native and mapped values, and smartly selecting an appropriate result.

In one embodiment, a value 151 is identified. Lookup value 152 typically includes value 151 directly. A lookup operation is performed in associative memory 153, which has already been programmed accordingly with associative memory entries, and lookup result 154 is generated. Lookup result 154 typically includes a HIT-A indication 162 (e.g., hit or miss). When a hit is generated, lookup result 154 is provided directly to selector 172 or used by optional adjunct memory 164 to produce RESULT-A 165 (e.g., an identifier of a value, range or action to be taken) which is provided to selector 172. In one embodiment implementing access control list functionality, RESULT-A 165 includes a global PRIORITY-A indication 166, which typically indicates a relative or absolute position or priority in the access control list and is provided to selection control 170.

Typically simultaneously, mapping engine 155 generates lookup value 156 which includes a mapped value corresponding to value 151. A lookup operation is performed in associative memory 157, which has already been programmed accordingly with mapped associative memory entries, and lookup result 158 is generated. Lookup result 158 typically includes a HIT-B indication 161 (e.g., hit or miss). When a hit is generated, lookup result 158 is provided directly to selector 172 or used by optional adjunct memory 167 to produce RESULT-B 168 (e.g., an identifier of a value, range or action to be taken) which is provided to selector 172. In one embodiment implementing access control list functionality, RESULT-B 168 includes a global PRIORITY-B indication 169, which typically indicates a relative or absolute position or priority in the access control list and is provided to selection control 170.

Selection control 170, typically based on one or all of HIT-A 162, HIT-B 161, PRIORITY-A 166 and/or PRIORITY-B 169, configures selector 172 to select between RESULT-A 165 and RESULT-B 168 to produce result 175 (e.g., a match/range identifier, value, pointer, etc.)

Selection logic table 180 illustrates the operation of selection control 170 in one embodiment for controlling selector 172. As shown, selection logic table 180 includes rows hit/miss inputs 181 and selection 182. If HIT-A 162 and HIT-B 161 both indicate a hit, then RESULT-A 165 or RESULT-B 168 is selected based on which has a higher global priority value (e.g., based on PRIORITY-A 166 and PRIORITY-B 169 signals). Otherwise, RESULT-A 165 or RESULT-B 168 is selected based on which one corresponds to a hit (e.g., based on HIT-A 162 and HIT-B 161 signals); or if no hit is produced, then a miss indication is generated.

Figure 1E:
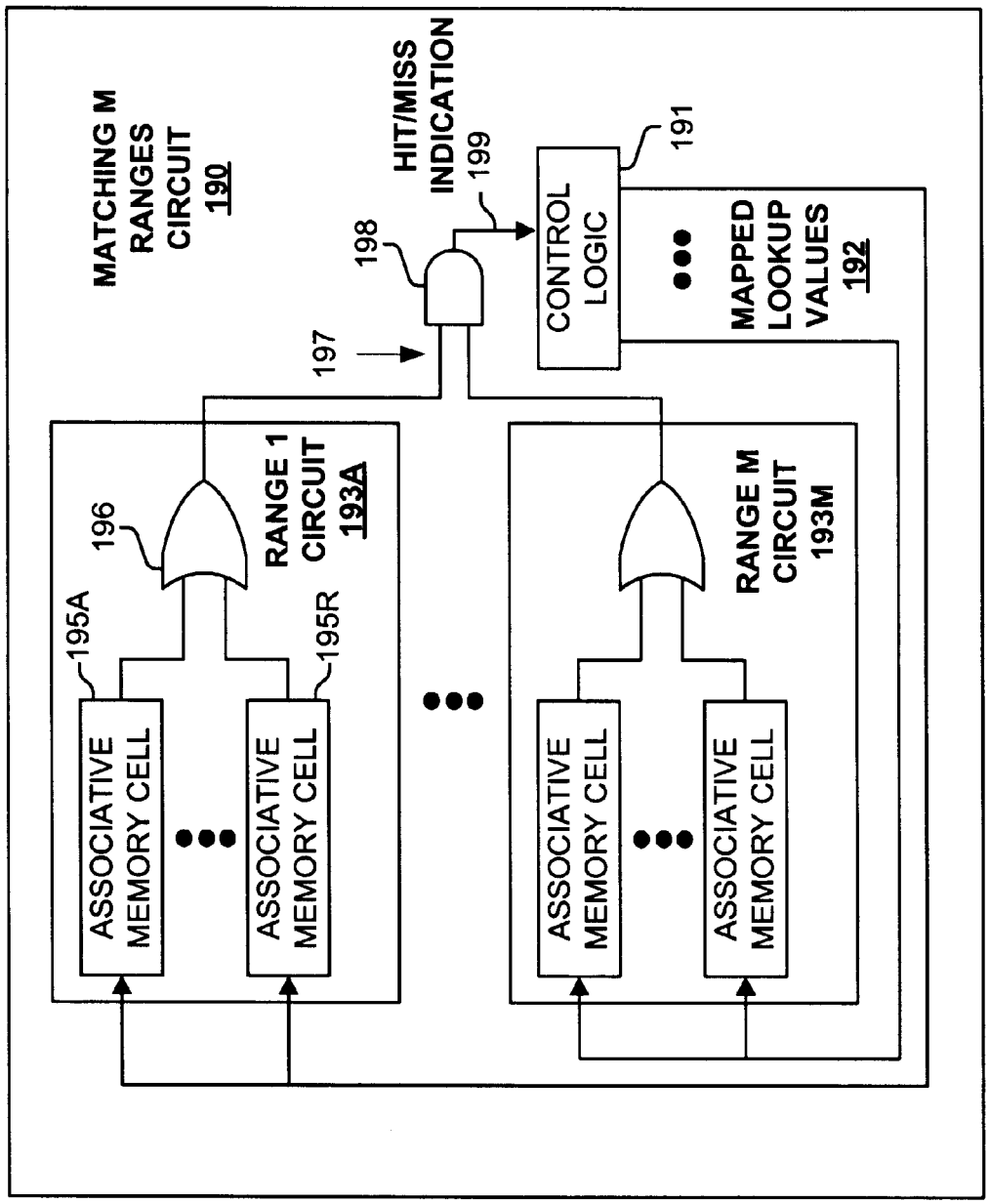

FIG. 1E illustrates one embodiment of a circuit 190 for identifying whether multiple ranges are matched simultaneously. For example, when routing a packet, it is often desirable to identify whether a packet matches a tuple of ranges, such as source address, destination address, and port ranges. As disclosed herein, each of these ranges could be mapped into a single associative memory entry, or multiple associative memory entries of a smaller width.

Circuit 190 is especially useful when each range is identified by multiple associative memory entries. Of course, other systems disclosed herein can be used to identifying whether multiple ranges are matched, such as by placing these systems in parallel and combining the results, or via a sequential process and combining the results. Circuit 190 is depicted just to show one embodiment of such a mechanism. Circuit 190 also has the advantage as it can be customized for its particular application to potentially reduce or minimize the size of circuit 190.

Circuit 190 illustrates one embodiment of a specialized circuit for determining when a tuple of ranges is matched. Each range circuit 193A–M includes the requisite number of associative memory cells required for representing the particular range. For example, range circuit 193A includes R associative memory cells 195A–R. For example, if seven associative memory entries were required to represent the range, then R would be at least seven. Note, the value of R can vary among the range circuits 193A–193M. The mapped values of each of the ranges of the range tuple are programmed into a corresponding one of the range circuits 193A–193M.

To determine if a range tuple is matched, control logic 191 generates (or these values are received from another component) the mapped lookup values 192 for each of the range circuits 193A–193M, which produce indications 197 whether there was a match, which are combined by element 198 (e.g., an AND gate, AND mechanism, or other combination circuit or logic) to produce hit/miss indication 199, which can be used by control 191 for further processing or directly or indirectly provided to another component.

FIG. 2A illustrates a mapping function 200 used in one embodiment for producing a bitmap or field for representing a range or value. For range boundaries having k bits, mapping function 200 produces a 2^k bit range field. For lower boundary A and upper boundary B of the range, a 2^k-bit bitmap is generated with: (1) bit positions (A+1) to (B−1) masked for the range between A and B, (2) bit positions (A) to (B) masked for the range between and including A and B, or (3) the bit position (A) masked when A and B are equal (e.g., a value or range of one value).

For example, for mapped representation 201 of B and mapped representation 202 of A, the corresponding range entry (bitmap) 203 is produced for the range between and including A and B. This mapping function is further illustrated in exemplary values and ranges table 210 illustrating various example mappings 211–218 to produce an eight-bit bitmap. For example, illustrated are the mapped values for two (row 211), five (row 212), the range between and including two and five (row 213), the range between two and five (row 214), the range between and including three and four (row 215), the range between and including zero and three (row 216), the range between and including three and seven (row 217), and the range between and including two and two (row 218). In one embodiment, the use of ones and zeros is reversed.

Figure 2B:
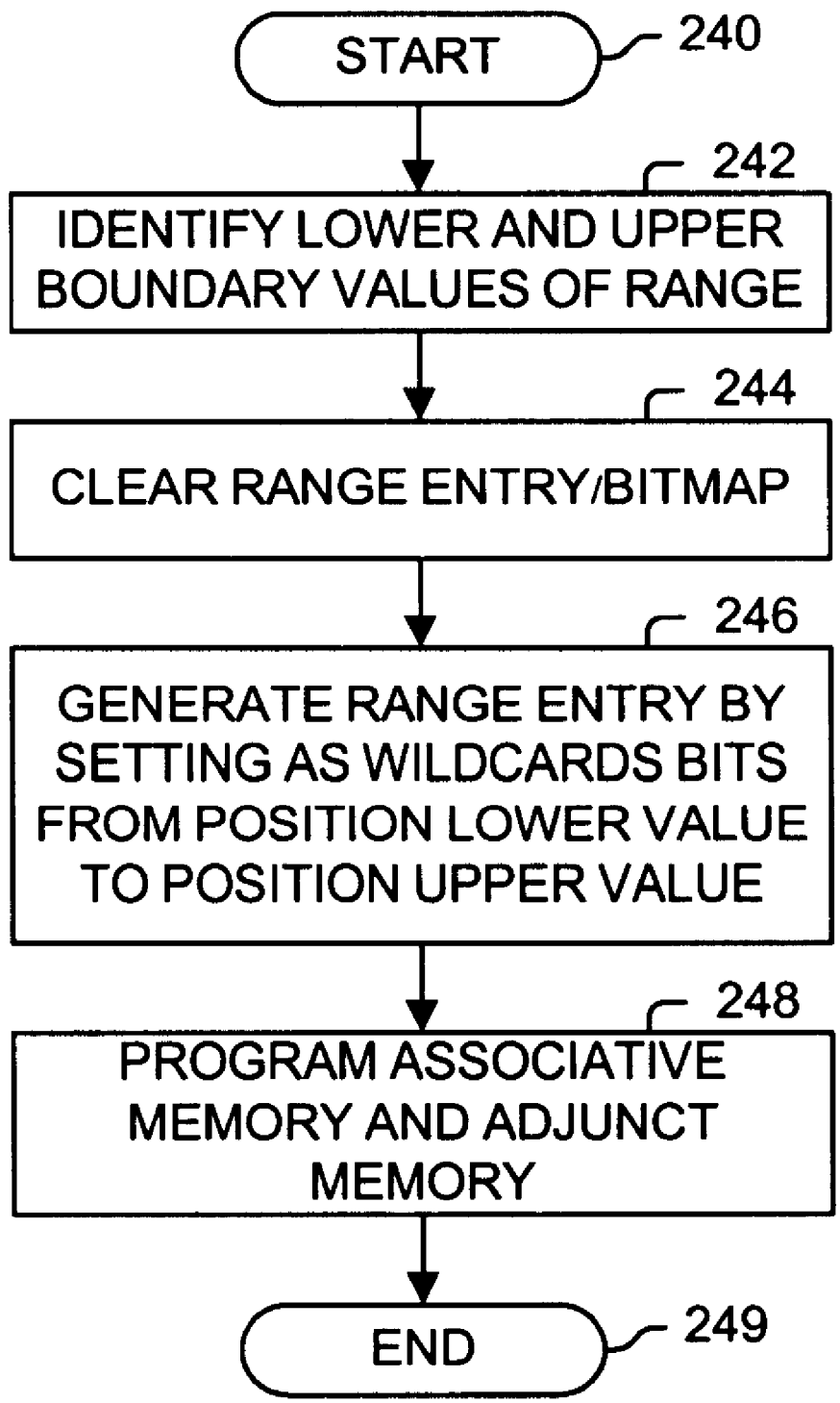
FIGS. 2B–C illustrate processes used in one embodiment for performing the mapping mechanism illustrated in FIG. 2A.
Figure 2C:
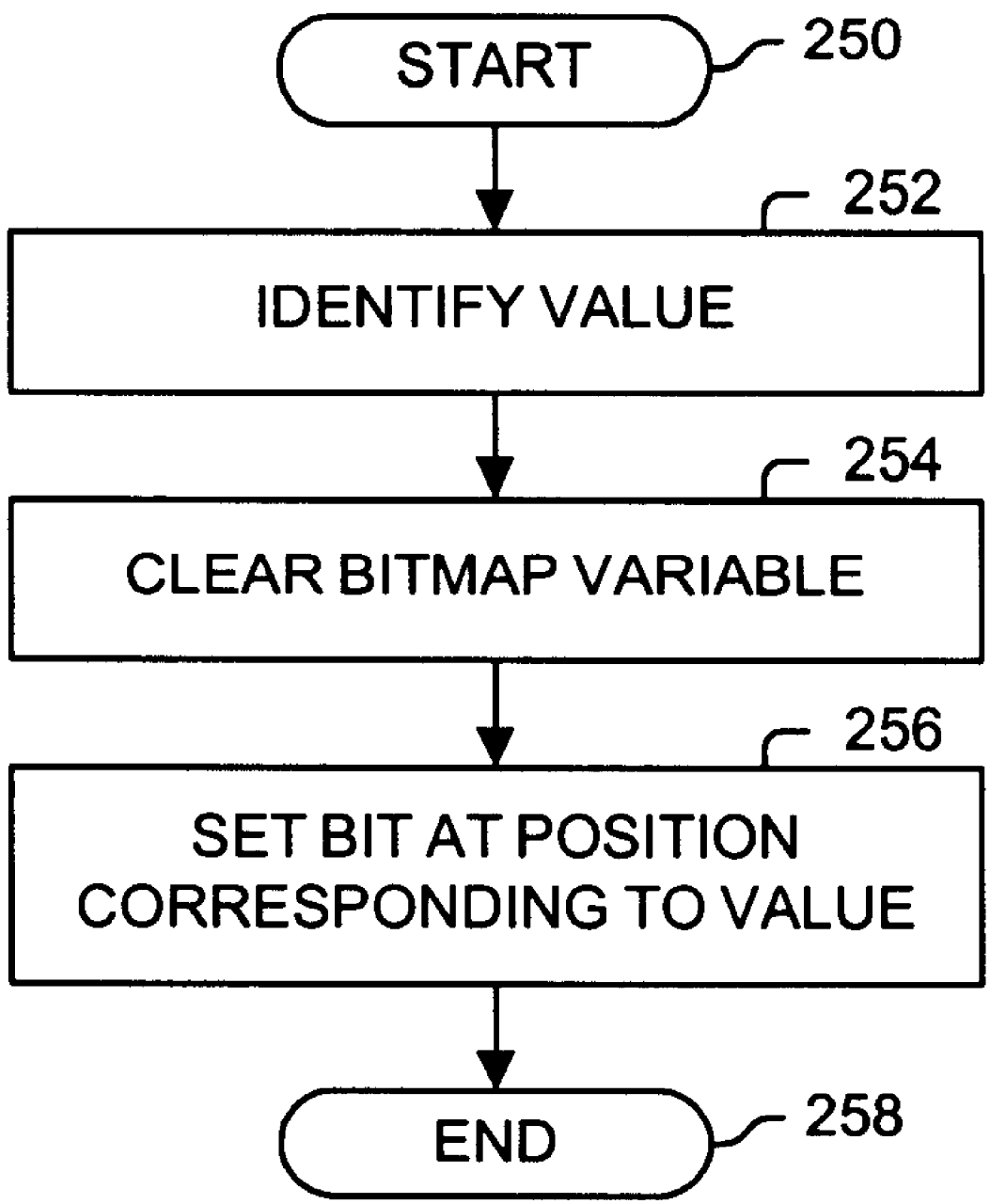

Many different methods and apparatus many be used to generate these mappings, and FIGS. 2B–C illustrate one such set of processes used in one embodiment for performing the mapping mechanism illustrated in FIG. 2A. Turning to FIG. 2B, processing begins with process block 240, and proceeds to process block 242, wherein a range is identified, typically, but not limited to identifying the lower and upper boundary values of the range. The range entry (e.g., bitmap) is cleared in process block 244. Next, in process block 246, the range entry is generated by setting as wildcards the bit positions from the lower to the higher range boundaries. In process block 248, the associative memory is programmed with this determined entry, and typically, an adjunct memory is also programmed with an identifier of the range. Processing is complete as indicated by process block 249.

FIG. 2C illustrates a process used in one embodiment for mapping a value for use in performing a lookup operation on an associative memory, such as one programmed using the process illustrated in FIG. 2B. Turning to FIG. 2B, processing begins with process block 250, and proceeds to process block 252, wherein a value is identified. Next, in process block 254, the bitmap variable is cleared. In process block 256, the bit at the position corresponding to the value is set. As indicated by process block 258, the mapping of the value is complete and the mapped value can then be used for subsequent processing.

Figure 2D:
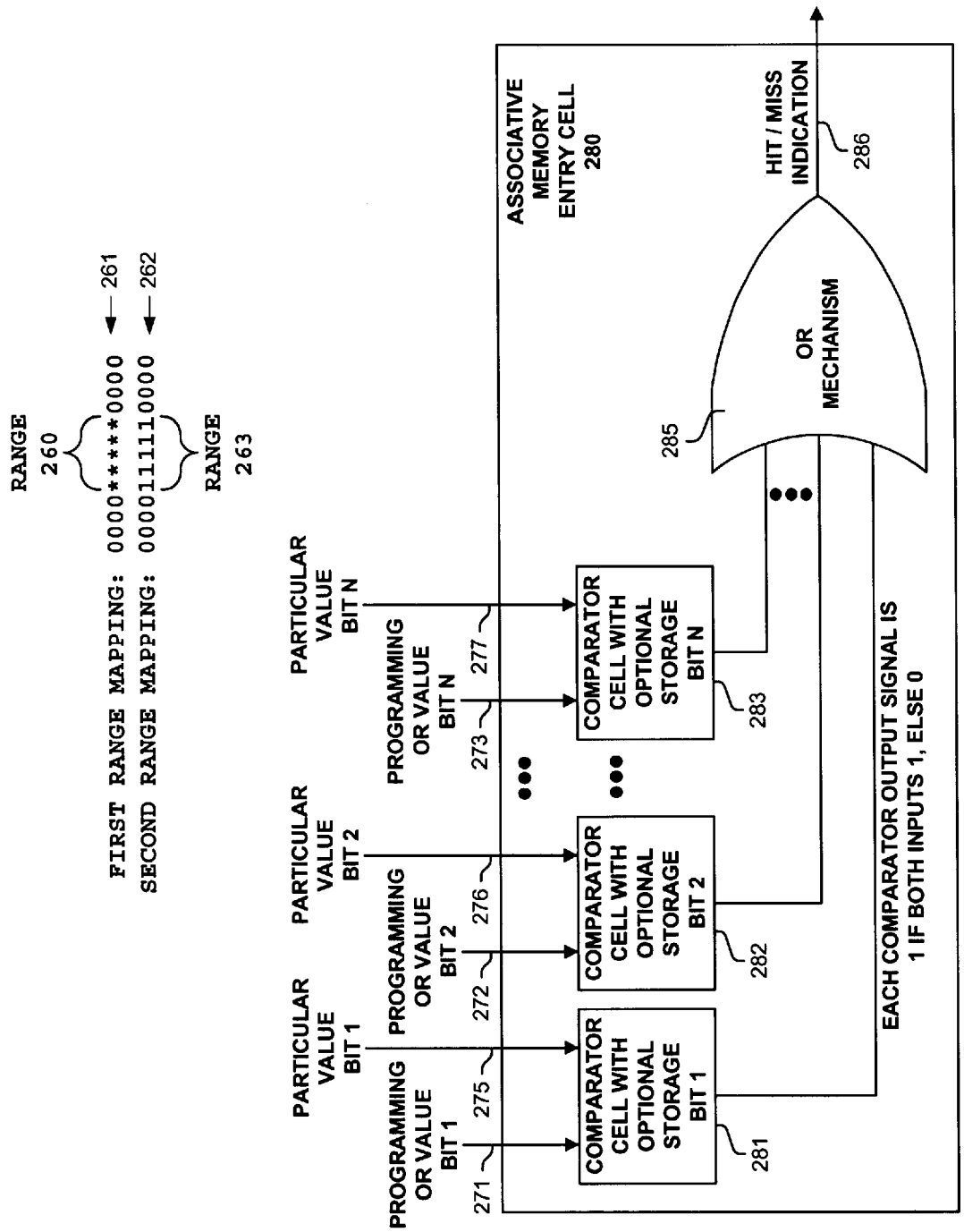
FIG. 2D is a block diagram of an alternative associative memory entry cell used in one embodiment.

FIG. 2D is a block diagram of an alternative associative memory entry cell 280 used in one embodiment. FIGS. 2A–C illustrate a mapping mechanism used in one embodiment, which that being illustrated at the top of FIG. 2D by first range mapping 261 with range 260 identified. Range 260 includes a series on one or more wildcards which can be readily stored in a TCAM. However, TCAMs are expensive in terms of power consumption and space, and FIG. 2D illustrates one alternative associative memory entry cell 280. By changing wildcards used to identify range 260 to a series of ones as illustrated in second range mapping 262 with range 263 identified by the series of ones, then associative memory entry cell 280 could be used to identify whether a value match a mapped range stored or provided to associative memory entry cell 280. The teachings of FIGS. 2A–C and their discussion are directly applicable to that of FIG. 2D with wildcards being replaced by ones, such as in process block 246 of FIG. 2B.

Referring to associative memory entry cell 280, the mapped value of the range is provided to associative memory entry cell 280 as bits 271–273 which are typically stored in comparator cell with optional storage 281–283 (or could be provided for each lookup operation). The mapped value for which to determine if a match exists is provided by particular value bits 275–277. Each comparator cell 281–283 performs a comparison operation and generates a one (or high) signal if both its stored value and its input are of value one, else it generates a zero (or low) signal. OR mechanism 285 (e.g., OR gate(s), OR circuitry, etc.) performs an OR operation on the signals received from comparator cell with optional storage 281–283 to generate hit/miss indication 286. Because the mapping function generates a single value of one in bits 275–277, then a hit is generated if a corresponding bit 271–273 is one. Thus, one embodiment uses an associative memory including multiple associative memory entry cells 280.

Figure 2E:
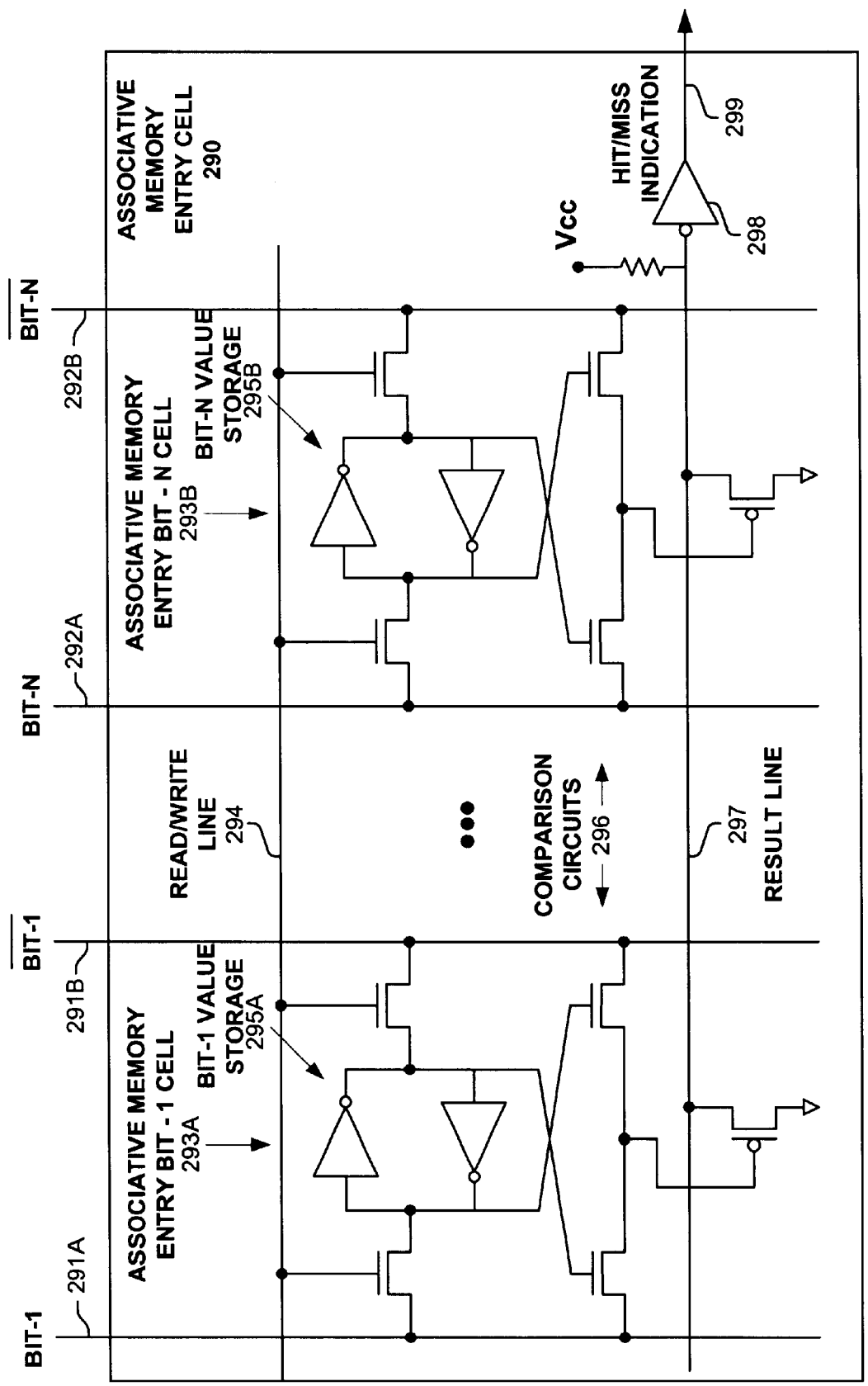
FIG. 2E is a block diagram of an alternative associative memory entry cell used in one embodiment.

FIG. 2E illustrates an alternative associative memory entry cell 290 used in one embodiment. Associative memory entry cell 290 includes one or more associative memory bit cells 293A–B, which each store a bit value and on which perform a comparison operation. The values of each bit are maintained in the storage cells 295A–B (e.g., in interconnected inverter elements or another standard or other configuration). Note, read/write line 294 is pulled high when values are stored in or read from the bit value storage cells 295A–B, and is pulled low when a comparison operation is being performed.

In one embodiment, the values of the particular input bits to be used in matching the stored values are provided as BIT-I (291A) and NOT BIT-I (291B) through BIT-N (292A) and NOT BIT-N (292B). In one embodiment, only one of these values is supplied to each of the associative memory entry bit cells 293A–B and they derive the other values, such as by using an inverter element. When there is a match between one of the supplied input bit values 291A–B through 292A–B and the corresponding stored value 295A–B, then result line 297 is pulled low by the corresponding one or more of the comparison circuits 296 of associative memory entry bit cells 293A–B. When there is no such match, result line 297 remains pulled high. The value of result line 297 is inverted by inverter 298, and hit/miss indication 299 is provided for further processing by other components.

Figure 3A:
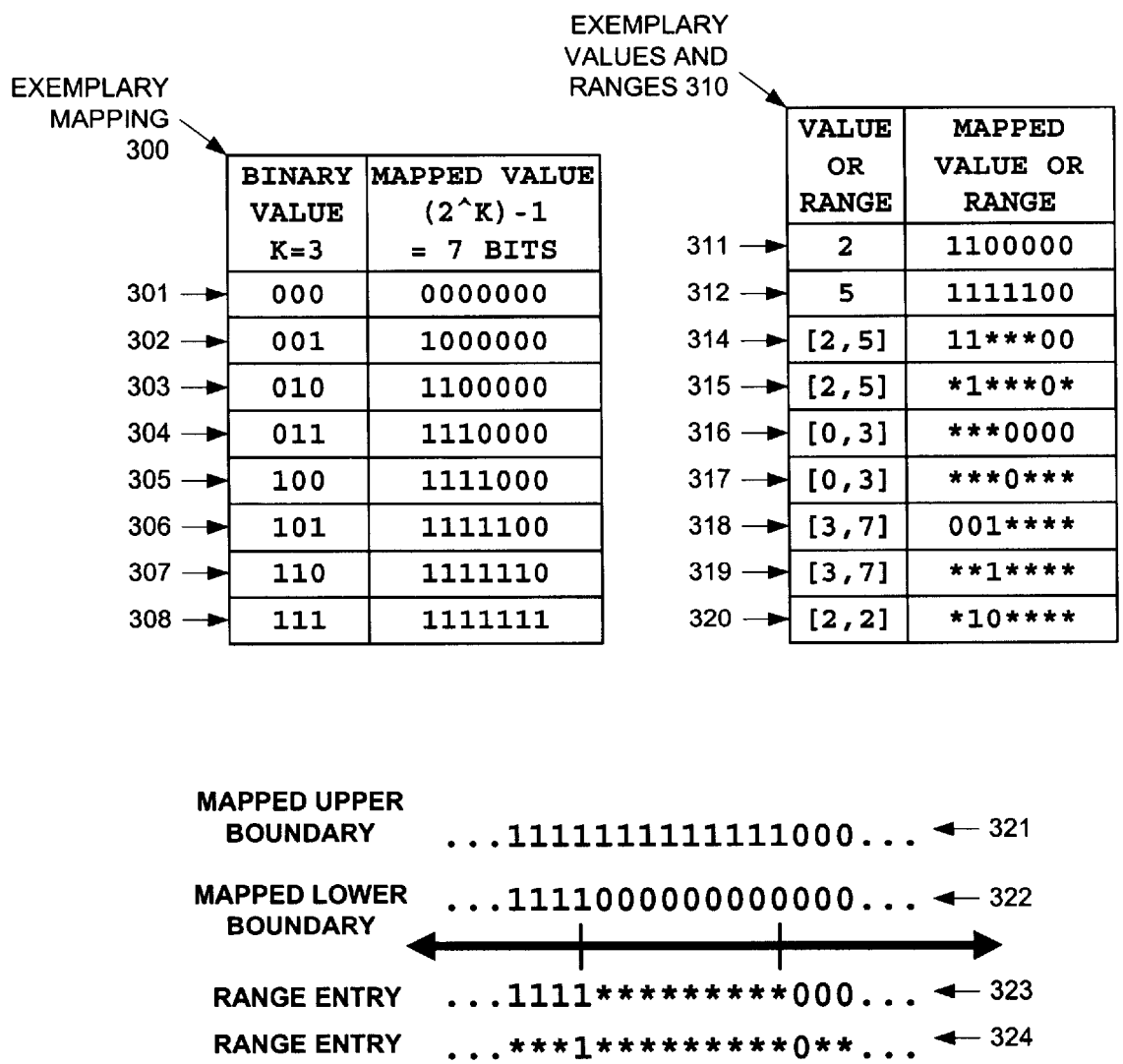
FIG. 3A illustrates a mapping mechanism used in one embodiment for mapping ranges and values into mapped values of particular use for storage in an associative memory.

FIG. 3A illustrates a mapping function used in one embodiment for producing a bitmap or field for representing a range or value. For range boundaries having k bits, the mapping function illustrated in FIG. 3A produces a $(2^k)-1$ bit range field. This mapping function is readily understood by looking at exemplary mapping 300 which illustrates mapping entries 301–308 for a three bit input value which generates a mapped value of seven bits. As shown, the value is indicated by a contiguous left-justified series of ones with the number of ones corresponding to the value. (Of course in one embodiment, the ones are right-justified and/or the use of ones and zeros are reversed.)

Corresponding mapping of ranges is illustrated by exemplary values and ranges 310, with mapped values and ranges 311–320 shown. In row 311, the value two is mapped as before, and in 312, the value of five is mapped as before. Next, the range between and including two and five is illustrated in row 314. This mapping is simply generated by for each bit position, if both corresponding bits of each range is the same use it (one or zero), otherwise use a wildcard. Entry 315 illustrates an alternative mapping for the same range as for entry 314. Remember, in one embodiment, the mapping function of a value is a contiguous left-justified series of ones, and thus if we know the position of the right-most one of the contiguous series, then it is inherent that the bits to the left of it are ones, and thus a wildcard can be used in these positions as illustrated in row 314. Similarly, the zeros to the right of the left-most zero are inherent based on this mapping mechanism, and thus they can also be replaced by wildcards. In other words, the mappings illustrated in rows 314 and 315 are equivalent for identification of a range, but advantages may be achieved by using one encoding over the other depending on the implementation of the embodiment. Additionally, rows 316 and 317 illustrate mappings for the range between and including zero and three; rows 318 and 319 illustrate mappings for the range between and including three and seven; and row 320 illustrates one mapping of the range including the value 2.

Thus, for a mapped value 321 of the upper boundary of a range and a mapped value 322 of the lower boundary of the range, the range can be mapped or encoded as illustrated by range entry 323 or range entry 324.

Figure 3B:
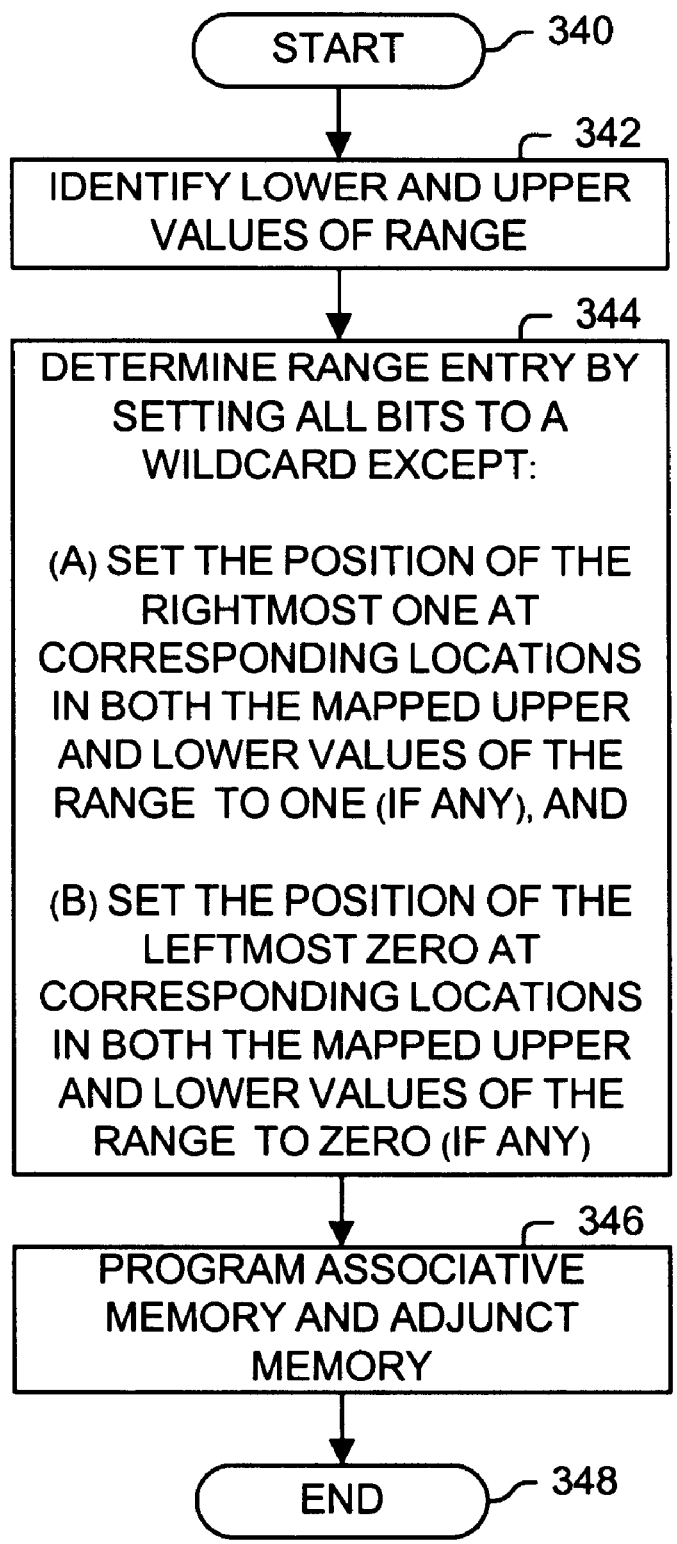
FIGS. 3B–C illustrate processes used in one embodiment for performing the mapping mechanism illustrated in FIG. 3A.
Figure 3C:
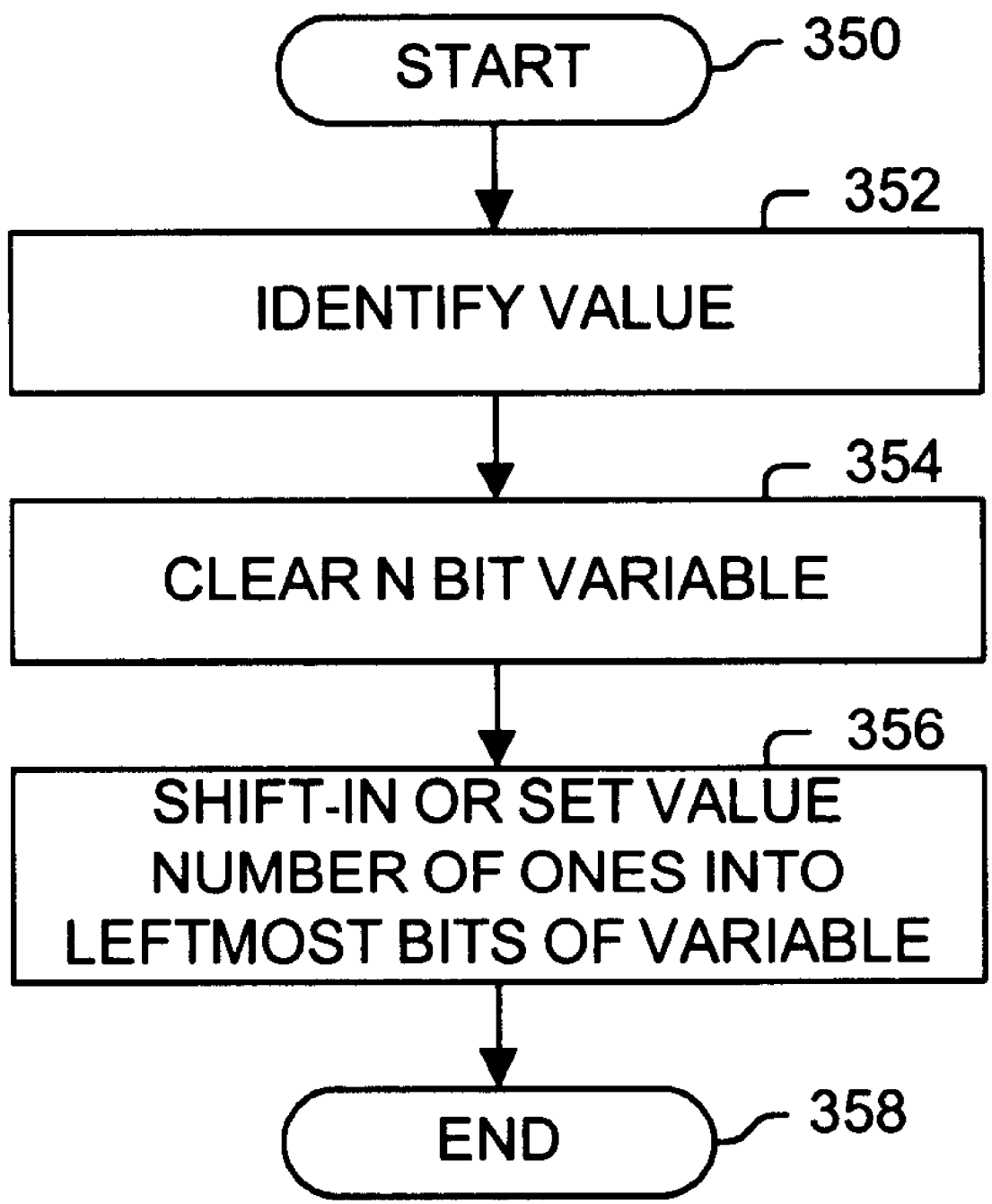

Many different methods and apparatus many be used to generate these mappings, and FIGS. 3B–C illustrate one such set of processes used in one embodiment for performing the mapping mechanism illustrated in FIG. 3A. Turning to FIG. 3B, processing begins with process block 340, and proceeds to process block 342, wherein a range is identified, typically, but not limited to identifying the lower and upper boundary values of the range. Next, in process block 344, the range entry is generated by determine range entry by setting all bits to a wildcard except: (a) set the position of the rightmost one at corresponding locations in both the mapped upper and lower values of the range to one (if any), and (b) set the position of the leftmost zero at corresponding locations in both the mapped upper and lower values of the range to zero (if any). In process block 346, the associative memory is programmed with this determined entry, and typically, an adjunct memory is also programmed with an identifier of the range. Processing is complete as indicated by process block 348.

FIG. 3C illustrates a process used in one embodiment for mapping a value for use in performing a lookup operation on an associative memory, such as one programmed using the process illustrated in FIG. 3B. Turning to FIG. 3B, processing begins with process block 350, and proceeds to process block 352, wherein a value is identified. Next, in process block 354, a number of bitmap variable is cleared. In process block 356, the value number of ones into leftmost bits of variable are shifted-in or set. As indicated by process block 358, the mapping of the value is complete and the mapped value can then be used for subsequent processing.

As illustrated by FIGS. 2A–C and 3A–C, a range of values can be mapped into a single field, which can be programmed into in an associative memory and on which, lookup operations can be performed to identify whether a value matches the range (e.g., the value is mapped and used as the lookup word or a portion thereof to the associative memory.) However, the width of these fields become very long as they are based on a power of two (e.g., $2^k$ or $2^k-1$).

FIG. 4A illustrates a mechanism for generating one or more subtrie values for identifying a range, each of the subtrie values identifying a different subset of the range. By dividing the upper and lower boundaries into groups of bits of width K (or a maximum of K as all might not have the same width), multiple fields can be used to represent the range for each group or level in the trie corresponding to these groupings. Thus, for a field of width N, N/K (rounded up) number of groups will be required. These groups can then be mapped (e.g., encoded) into identifiable ranges within each group of bits, with each group typically mapped into values containing 2^K or 2^K−1 bits, with a maximum number of (2*N/K)−1 values (mapped entries) required to represent the entire range. Thus for an original range of width eight bits and divided into groups of two bits, each range entry will be divided four groups of width two bits, with each mapped value (e.g., range entry) containing twelve or sixteen bits (e.g., four groups times three or four bits per group), with a maximum number of seven entries (mapped values) required to represent the range. Of course other mappings/encoding mechanisms can be used in keeping within the scope and spirit of the invention which may require the same, less, or more numbers of bits or entries.

Referring to FIG. 4A, illustrated is an exemplary trie range mapping 400 of a range mapped into multiple subtrie values identifying a range, with each subtrie value identifying a different subset of the range. In this example, the range will be split into groups of width two bits. Legend 420 shows by item 421 that the lower boundary for this exemplary range is seventeen and its binary value in groups of two bits. Item 422 shows the upper boundary for this exemplary range is one hundred and its binary value in groups of two bits.

Subtries 411 and 412 represent subtries based on strides or groupings of bits of width two (of course the teachings herein apply to groupings of any width.) Subtrie 411 includes the subtrie representing seventeen and subtrie 412 includes the subtrie representing one hundred. As the range between seventeen and one hundred is being mapped/encoded in a mechanism for readily identification and matching, the subtries corresponding to those between seventeen and one hundred need to be identified. These are subtrie A 401, subtrie B 402, subtrie C 403, subtrie D 404, subtrie E 405, and subtrie F 406, which are also represented in tabular form in items 431–436 of legend 420. In one view, each subtrie is captured at each level to the right of the lower boundary and to the left of the upper boundary. Each of these subtrie ranges can then be mapped to values using the exemplary mapping techniques disclosed herein or using any other mapping technique to generate the range entries. FIGS. 4B and 4C illustrate these entries for the mappings illustrated in FIGS. 2A–C and FIGS. 3A–C, respectively.

Referring to first to FIG. 4B, items 431–436 correspond to items 431–436 illustrated in FIG. 4A, which represent the subtries to be mapped. Entries 441–450 illustrate one mapping of ranges for groups of two bits, and the mappings of two-bit values are shown in table 440. Mechanisms for generating these mapped entries are illustrated in FIGS. 2A–C, so this discussion is not repeated here. The mapped subtrie ranges to be programmed into the associative memory are illustrated by entries 451–456, which are simply entries 431–436 replaced with corresponding mapped values from mapping entries 441–450. Thus, subtrie A 401 (FIG. 4A) is mapped into associative memory entry having a value of "*00000********" as shown by entry 451**. Thus, for an eight bit wide input field, a range can be mapped into at most six entries of width sixteen bits.

Referring to next to FIG. 4C, similarly, items 431–436 correspond to items 431–436 illustrated in FIG. 4A, which represent the subtries to be mapped. Entries 461–470 illustrate one mapping of ranges for groups of two bits, and the mappings of two-bit values are shown in table 460. Mechanisms for generating these mapped entries are illustrated in FIGS. 3A–C, so this discussion is not repeated here. The mapped subtrie ranges to be programmed into the associative memory are illustrated by entries 471–476, which are simply entries 431–436 replaced with corresponding mapped values from mapping entries 461–470. Thus, subtrie A 401 (FIG. 4A) is mapped into associative memory entry having a value of "0*1****" as shown by entry 471**. Thus, for an eight bit wide input field, a range can be mapped into at most six entries of width twelve bits. The exact number of entries required may vary among ranges as subtries only need to be included for those beginning with the first grouping of bits that is different between the range boundaries.

Additionally, the number of associative memory entries required and their corresponding width can be thus be adjusted by selecting the width of the groupings of bits and the range mapping mechanism.

FIG. 4D illustrates a mechanism for generating one or more subtrie values identifying a range, each of the mapped subtrie values identifying a different subset of the range. FIG. 4D is quite similar to that illustrated in FIG. 4A, with the main difference being that the upper value of the range is now 228 (rather than 100), and thus, there are one or more subtries 481–482 to be mapped at the first level in the trie 480 wherein the values of the upper and lower boundaries of the range are different. Legend 490 lists the values of the subtries A–H 481–488 encompassing the range of 17 to 228 as defined in one embodiment. The mapping process for each of these subtries is clearly and completely described herein, and to be concise, this description will not be repeated here.

Figure 5:
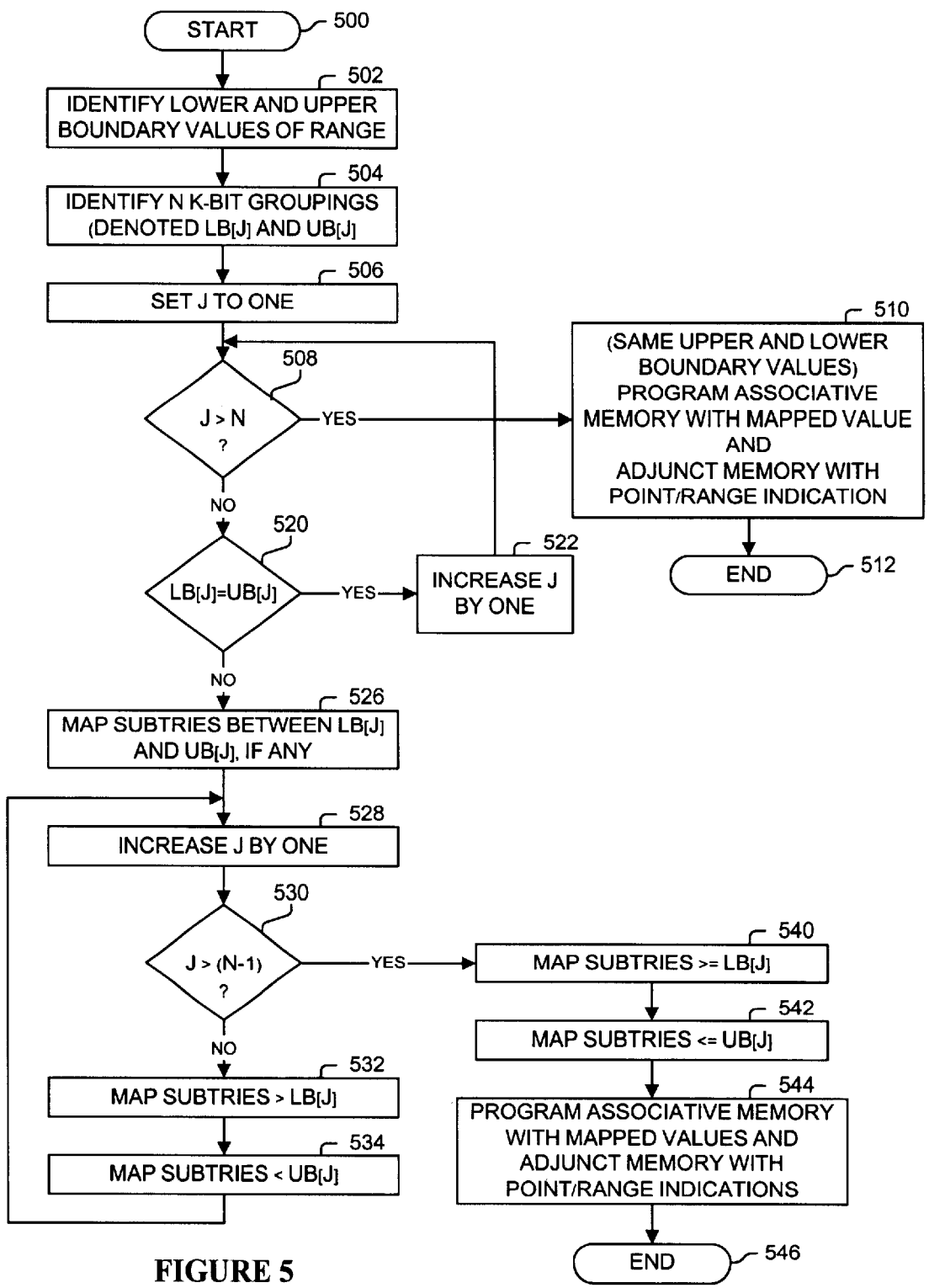
FIG. 5 illustrates a process used in one embodiment for generating one or more mapped subtrie values identifying a range, each of the mapped subtrie values identifying a different subset of the range.

FIG. 5 illustrates a process used in one embodiment for identifying and mapping subtries corresponding to a range. Processing begins at process block 500, and proceeds to process block 502, wherein the lower and upper boundary values of the range to be mapped are identified. Next, in process block 504, the width K and number N groupings of the bits for mapping the range are identified. For purposes of this explanation, each of the groupings can be referenced by a value from one to N, with LB[J] indicating grouping J of the lower boundary groupings of bits and UB[J] indicating grouping J of the upper boundary groupings of bits. These groupings will be sequenced through, and beginning with the first set of groupings of bit that differ between the upper and lower boundary values, each of the subtries within the range is identified and mapped (e.g., according to one of the mapping mechanisms disclosed herein or any other mapping mechanism).

In doing so, first J is set to one in process block 506. As determined in process block 508, if J is greater than N, then there were no differing groupings of bits (i.e., the upper and lower boundary is the same value), and in process block 510, the associative memory is programmed with a mapped value for this value, and optionally, an adjunct memory is programmed with an identifier of this value (or single value width range) at a corresponding location. Processing is then complete as indicated by process block 512. Otherwise, as determined in process block 520, if LB[J] and UB[J] are equal, then in process block 522, J is increased by one, and processing returns to process block 508.

Otherwise, there is some difference in the groupings and processing proceeds to process block 526, wherein any if there are any subtries between LB[J] and UB[J] (e.g., subtries A 481 and B 482 of FIG. 4D), these are mapped according to some range mapping mechanism. Not all ranges will have subtries between LB[J] and UB[J], for example, FIG. 4A illustrates on such range which does not. J is then increased in process block 526 to descend to the next level.

As determined in process block 530, if J is greater than (N–1) (e.g., not at the lowest level of the corresponding trie), then in process block 532, the range of subtries greater than that at level J of the lower bound value is mapped according to some range mapping mechanism. Next, in process block 534, the range of subtries less than that at level J of the upper bound value is mapped according to the range mapping mechanism. Processing returns to process block 528, wherein J is increased by one, and then processing returns to process block 530.

Otherwise, processing proceeds from process block 530 to process block 540 to map the lowest level of the trie. Note, because it is the lowest level, the value of equal to the upper and lower boundary values must also be mapped. So, in process block 540, the range of subtries greater than or equal to that at level J of the lower bound value is mapped according to the range mapping mechanism. Next, in process block 542, the range of subtries less than or equal that at level J of the upper bound value is mapped according to the range mapping mechanism. As the mapping is complete, in process block 544, the associative memory is programmed with these mapped range values, and optionally, an adjunct memory is programmed with an identifier of this range at locations corresponding to each of the programmed associative memory entries for this range. Processing is then complete as indicated by process block 546. Note, in one embodiment, the associative memory and optionally the adjunct memory are programmed as ranges are mapped rather than all at once.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An apparatus for maintaining a range of values, the apparatus comprising:
    a range programming engine for generating a plurality of mapped subtrie values identifying the range, each of the mapped subtrie values identifying a different subset of the range;
    an associative memory, coupled to the range programming engine, for storing the plurality of mapped subtrie ranges; and
    a mapping engine, coupled to the associative memory, for receiving a particular value and generating a lookup word including a mapped representation of the particular value;
    wherein the apparatus is configured to provide the lookup word to the associative memory and for the associative memory to perform a lookup operation based on the lookup word to identify whether or not the particular value is within the range.

2. The apparatus of claim 1, wherein the mapped representation of the particular value includes a bitmap with a single set bit, the position of the single set bit within the bitmap corresponding to the particular value.

3. The apparatus of claim 2, wherein each of the plurality of mapped subtrie values includes no bits of value one.

4. The apparatus of claim 2, wherein the mapped particular value includes a value bitmap, the value bitmap including a bit transition, the position of the bit transition corresponding to the particular value.

5. The apparatus of claim 1, wherein a subset of the plurality of mapped subtrie values each include a contiguous set of one or more wildcards, the position of the contiguous set of one or more wildcards identifying values within the range.

6. The apparatus of claim 5, wherein the mapped representation of the particular value includes a bitmap with a single set bit, the position of the single set bit within the bitmap corresponding to the particular value.

7. The apparatus of claim 1, wherein a subset of the plurality of mapped subtrie values each include a contiguous set of one or more ones, the position of the contiguous set of one or more ones identifying values within the range.

8. The apparatus of claim 7, wherein the mapped representation of the particular value includes a bitmap with a single set bit, the position of the single set bit within the bitmap corresponding to the particular value.

9. The apparatus of claim 7, wherein the associative memory includes a plurality of associative memory entry cells, each of the plurality of associative memory cells including a plurality of bit comparator cells coupled to an OR mechanism to generate a hit or miss indication.

10. A method for use in maintaining a range of values, the method comprising:
    identifying a lower boundary value of the range;
    identifying an upper boundary value of the range;
    identifying corresponding groupings of bits of the lower and upper boundary values which correspond to a trie encapsulating the range; and
    generating one or more mapped range values, each of said one or more mapped range values corresponding to a different subtrie or value within the trie.

11. The method of claim 10, comprising programming an associative memory with each of said one or more mapped range values.

12. The method of claim 11, comprising programming an adjunct memory with range identifiers corresponding to said each of said one or more mapped range values.

13. The method of claim 11, comprising:
    identifying a particular value;
    mapping the particular value to a mapped particular value;
    performing a lookup operation based on the mapped particular value in the associative memory to identify whether or not the particular value is within the range.

14. The method of claim 13, wherein the mapped particular value includes a bitmap with a single set bit, the position of the single set bit within the bitmap corresponding to the particular value.

15. The method of claim 14, wherein each of said one or more mapped range values includes no bits of value one.

16. The method of claim 15, wherein the mapped particular value includes a bitmap, the bitmap including a bit transition, the position of the bit transition corresponding to the particular value.

17. The method of claim 10, wherein each of said corresponding groupings of bits includes k bits, and wherein each of said one or more mapped range values comprises exactly two raised to the kth power bits.

18. The method of claim 10, wherein each of said corresponding groupings of bits includes k bits, and wherein each of said one or more mapped range values comprises exactly one less than two raised to the kth power bits.

19. An apparatus for maintaining a range of values, the apparatus comprising:
   a first associative memory for storing range entries and to generate a first lookup result based on a particular value;
   a mapping engine for generating a mapped particular value based on the particular value;
   a second associative memory for storing mapped values corresponding to subtries of the range and to generate a second lookup result based on the mapped lookup value;
   a mechanism for producing a first result based on the first lookup result;
   a mechanism for producing a second result based on the second lookup result; and
   a selector for selecting between the first and second results.

20. The apparatus of claim 19, wherein the mapped particular value includes a bitmap with a single set bit, the position of the single set bit within the bitmap corresponding to the particular value.

21. The apparatus of claim 19, wherein the mapped particular value includes a value bitmap, the value bitmap including a bit transition, the position of the bit transition corresponding to the particular value.

22. The apparatus of claim 19, wherein the mechanism for producing the first lookup result includes a first adjunct memory; and the mechanism for producing the second lookup result includes a second adjunct memory.

23. The apparatus of claim 22, wherein the first and second adjunct memories generate global priority indications based respectively on the first and second lookup results; and the selector is configured to select between the first and second results based on said global priority indications.

24. The apparatus of claim 23, wherein the first and second lookup results include hit/miss indications, and the selector is configured to select between the first and second results based on said hit/miss indications.

25. The apparatus of claim 19, wherein the first and second lookup results include hit/miss indications, and the selector is configured to select between the first and second results based on said hit/miss indications.

26. An apparatus for use in maintaining a range of values, the apparatus comprising:
   means for identifying a lower boundary value of the range;
   means for identifying an upper boundary value of the range;
   means for identifying corresponding groupings of bits of the lower and upper boundary values which correspond to a trie encapsulating the range; and
   means for generating one or more mapped range values, each of said one or more mapped range values corresponding to a different subtrie or value within the trie.

27. The apparatus of claim 26, comprising:
   means for identifying a particular value;
   means for mapping the particular value to a mapped particular value;
   means for performing a lookup operation based on the mapped particular value in the associative memory to identify whether or not the particular value is within the range.

28. The apparatus of claim 27, wherein the mapped particular value includes a bitmap with a single set bit, the position of the single set bit within the bitmap corresponding to the particular value.

29. The apparatus of claim 27, wherein the mapped particular value includes a bitmap, the bitmap including a bit transition, the position of the bit transition corresponding to the particular value.

30. An apparatus for maintaining a range of values, the apparatus comprising:
   means for generating one or more associative memory entries based on an input range, each of said one or more associative memory entries identifying a subset of the range by a consecutive set of bits or a bit value transition;
   means for programming said one or more associative memory entries into one or more associative memories;
   means for mapping an input value to a lookup word; and
   means for performing a lookup operation on said one or more associative memories based on the lookup word to identify whether the input value falls within the range of values.

31. The apparatus of claim 30, wherein each of said one or more associative memory entries includes a bitmap with a single set bit, the position of the single set bit within the bitmap corresponding to the particular value.

32. The apparatus of claim 31, each of said one or more associative memory entries includes no bits of value one.

33. The apparatus of claim 31, wherein the lookup word includes a lookup word bitmap, the lookup word bitmap including a bit transition, the position of the bit transition corresponding to the particular value.

34. The apparatus of claim 30, wherein a subset of the plurality of mapped subtrie values each include a contiguous set of one or more wildcards, the position of the contiguous set of one or more wildcards identifying values within the range.

35. The apparatus of claim 34, wherein the mapped representation of the particular value includes a bitmap with a single set bit, the position of the single set bit within the bitmap corresponding to the particular value.

36. The apparatus of claim 30, wherein a subset of the plurality of mapped subtrie values each include a contiguous set of one or more ones, the position of the contiguous set of one or more ones identifying values within the range.

37. The apparatus of claim 36, wherein the mapped representation of the particular value includes a bitmap with a single set bit, the position of the single set bit within the bitmap corresponding to the particular value.

* * * * *

UNITED STATES PATENT AND TRADEMARK OFFICE
CERTIFICATE OF CORRECTION

PATENT NO. : 6,717,946 B1
DATED : April 6, 2004
INVENTOR(S) : Hariguchi et al.

It is certified that error appears in the above-identified patent and that said Letters Patent is hereby corrected as shown below:

Column 2,
Line 65, add -- BRIEF -- before "DESCRIPTION OF THE DRAWINGS"

Column 11,
Line 40, replace "BIT-I (291A)" with -- BIT-1 (291A) --
Line 40, replace "NOT BIT-I (291B)" with -- NOT BIT-1 (291B) --

Signed and Sealed this

Second Day of August, 2005

JON W. DUDAS
*Director of the United States Patent and Trademark Office*